(12) United States Patent
Matsuzaki

(10) Patent No.: US 9,336,853 B2
(45) Date of Patent: May 10, 2016

(54) MEMORY DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Takanori Matsuzaki, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/723,551

(22) Filed: May 28, 2015

(65) Prior Publication Data

US 2015/0348608 A1    Dec. 3, 2015

(30) Foreign Application Priority Data

May 29, 2014    (JP) .................................. 2014-110726

(51) Int. Cl.
G11C 7/00 (2006.01)
G11C 11/406 (2006.01)
G11C 11/4074 (2006.01)

(52) U.S. Cl.
CPC .......... *G11C 11/406* (2013.01); *G11C 11/4074* (2013.01)

(58) Field of Classification Search
CPC .... G11C 11/406; G11C 11/4074; G11C 7/02; G11C 2211/4067; G11C 5/147
USPC ................. 365/222, 189.09, 210.11
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — David Lam
(74) *Attorney, Agent, or Firm* — Fish & Richardson P.C.

(57) ABSTRACT

Provided is a memory device having a plurality of memory cells and a refresh circuit. Each of the memory cells is configured to retain multiple data as a potential of a node connected to a gate of a first transistor, one of a source and a drain of a second transistor, and one of electrodes of a capacitor. The refresh circuit is configured to refresh the memory cells. That is, the refresh circuit is configured to determine an interval between refresh operations, estimate a change of the potential of the node due to the leakage of the charge, and provide a refresh potential to the memory cells, where the refresh potential is a sum of the potential read from the node and the potential lost due to the charge leakage.

19 Claims, 30 Drawing Sheets

(56) References Cited

U.S. PATENT DOCUMENTS

| | | | |
|---|---|---|---|
| 7,064,996 B2 * | 6/2006 | Dobler | G11C 11/406 365/149 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,339,828 B2 | 12/2012 | Yamazaki et al. | |
| 8,363,452 B2 | 1/2013 | Yamazaki et al. | |
| 8,406,038 B2 | 3/2013 | Saito et al. | |
| 8,614,916 B2 | 12/2013 | Nagatsuka et al. | |
| 8,619,454 B2 | 12/2013 | Yamazaki et al. | |
| 8,659,935 B2 | 2/2014 | Yamazaki et al. | |
| 8,804,396 B2 | 8/2014 | Yamazaki et al. | |
| 9,001,563 B2 | 4/2015 | Atsumi et al. | |
| 9,001,566 B2 | 4/2015 | Yamazaki et al. | |
| 9,007,813 B2 | 4/2015 | Saito et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2011/0101351 A1 | 5/2011 | Yamazaki | |
| 2012/0037972 A1 | 2/2012 | Yoneda | |
| 2012/0039126 A1 | 2/2012 | Saito et al. | |
| 2014/0167041 A1 | 6/2014 | Yamazaki et al. | |
| 2014/0340953 A1 | 11/2014 | Yamazaki et al. | |
| 2015/0262642 A1 | 9/2015 | Koyama | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 A | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters). May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3-A2O3-Bo Systems [A; Fe, Ga, Or Al; B: Mg, Mn, Fe, Ni, Cu, Or, Zn] at Temperatures over 1000° C", Journal of Solid State Chemistry, 1985, vol. 60, pp. 382-384.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3,

(56) References Cited

OTHER PUBLICATIONS and Ga2O3(ZnO)m (m = 7, 8, 9, and 16) in the In2O3-Zn-Ga2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Device, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of The 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID Internatioanl Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of Internatioanl Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performace TFT", SID Digest '07 : SID International Symposium Digest of Technical Papers, 2007, vol. 38, pp. 1830-1833.

Hirao.T at al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M. "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43. No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symosium Digest of Technical Papers, May 20, 2008, vol. 39, No. 1, pp. 1-4.

Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of Igzo Transparent Amorphous Oxide Semiconductor", IDW '08 : Proceedings of The 15th International Display Workshops, Dec. 3, 2008, pp. 1637-1640.

Sakata.J et al., "Development of 4.0-In. AMOLED Display With Driver Circuit Using Amorphous In-Ga-Zn-Oxide TFTs", IDW '09 : Proceedings of The 16th International Display Workshops, 2009, pp. 689-692.

Asaoka.Y et al., "29.1:Polarizer-Free Reflective LCD Combined With Ultra Low-Power Driving Technology", SID Digest '09 : SID Internatioanl Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In-Ga-Zn-Oxide TFT", SID Digest '09 : SID International Symposium of Technical Papers, May 31, 2009, pp. 184-187.

Ohara.H et al., "21.3:4.0 In. QVGA AMOLED Display Using In-Ga-Zn-Oxide TTFs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Ohara.H et al., "Amorphous In-Ga-Zn-Oxide TFTs with Suppressed Variation for 4.0 inch QVGA AMOLED Display", AM-FPD '09 Digest of Technical papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM NEWSLETTER. Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability. Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semicondutor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GiZo (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium of Technical Papers, May 20, 2008, vol. 39, pp. 629-632.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008. pp. 581-584.

Asakuma.N et al., "Crystallization and Reduction of Sol-Gel-Derived Zinc Oxide Films by Irradiation with Ultraviolet Lamp", Jounal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Jounral of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

FIG. 10A
FIG. 10B
FIG. 10C
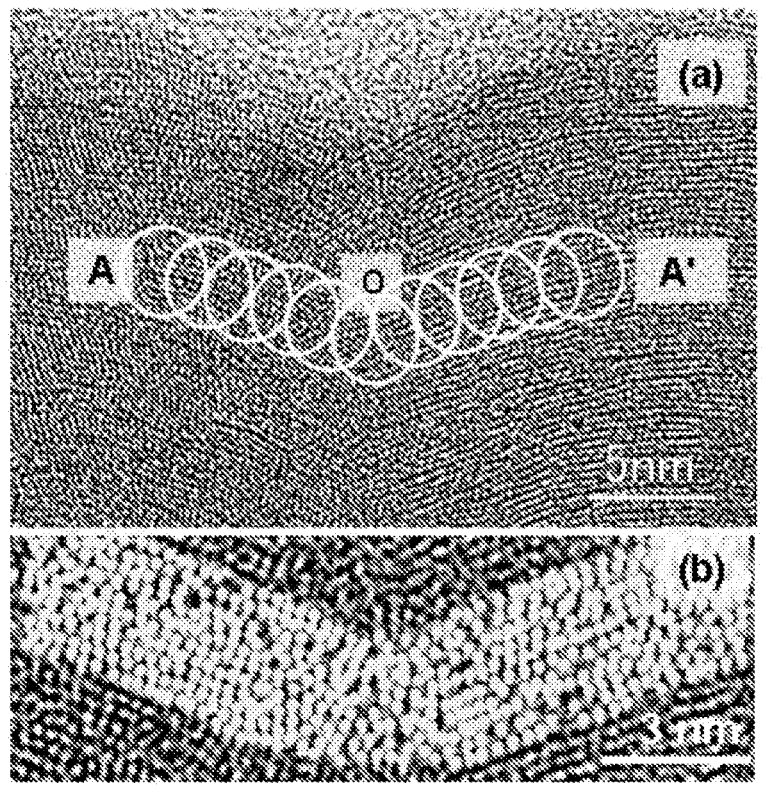
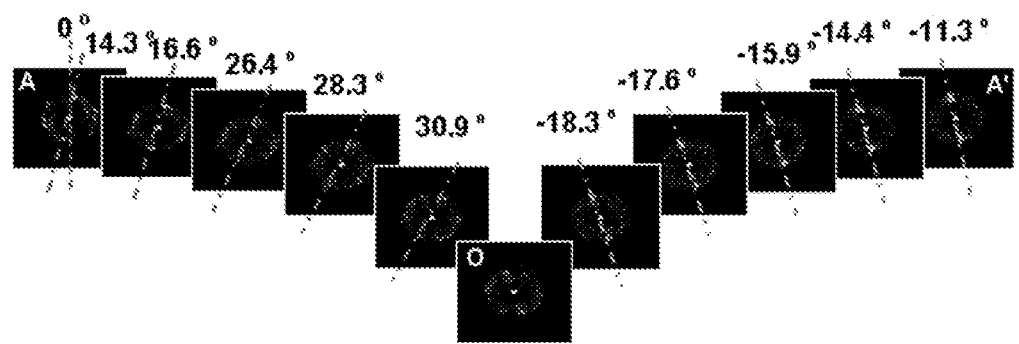

CAAC-OS nc-OS as-sputtered after 450 °C heating 24  22

24  22  23

44

MEMORY DEVICE, ELECTRONIC COMPONENT, AND ELECTRONIC DEVICE

BACKGROUND OF THE INVENTION

1. Field of the Invention

One embodiment of the present invention relates to a memory device, an electronic component, and an electronic device.

Note that one embodiment of the present invention is not limited to the above technical field. Specifically, examples of the technical field of one embodiment of the present invention disclosed in this specification include a semiconductor device, a display device, a light-emitting device, a memory device, a method for driving any of them, and a method for manufacturing any of them.

2. Description of the Related Art

Patent Document 1 discloses a memory device including a transistor in which an oxide semiconductor is used for a channel formation region (hereinafter referred to as OS transistor) and a transistor in which silicon is used for a channel formation region (hereinafter referred to as Si transistor). Patent Document 1 also discloses that the OS transistor exhibits low off-state current.

REFERENCE

Patent Document 1: Japanese Published Patent Application No. 2012-256400

SUMMARY OF THE INVENTION

An object of one embodiment of the present invention is to provide a memory device, an electronic component, an electronic device, or the like.

Another object of one embodiment of the present invention is to provide a memory device or the like with excellent multilevel data retention characteristics.

Note that the objects of one embodiment of the present invention are not limited to the above. The objects described above do not disturb the existence of other objects. The other objects are objects that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a memory device including a memory cell and a refresh circuit. The memory cell has a function of retaining multilevel data by retaining a plurality of potentials. In the memory cell, the plurality of potentials are changed by charge transfer. The refresh circuit has a function of supplying the memory cell with a potential obtained by adding a potential read from the memory cell and a potential corresponding to the amount of potential change due to the charge transfer.

One embodiment of the present invention is a memory device including a memory cell and a refresh circuit including a compensation voltage generator circuit, a voltage adder circuit, and a refresh timing control circuit. The memory cell has a function of retaining multilevel data by retaining a plurality of potentials. In the memory cell, one of the plurality of potentials is changed by charge transfer. The compensation voltage generator circuit has a function of estimating the amount of the potential reduced by the charge transfer. The voltage adder circuit has a function of performing a refresh operation by supplying the memory cell with a potential obtained by adding a potential read from the memory cell and the potential estimated by the compensation voltage generator circuit. The refresh timing control circuit has a function of controlling an interval between refresh operations.

In the memory device of one embodiment of the present invention, the memory cell preferably includes a first transistor and a second transistor. It is preferred that one of a source and a drain of the first transistor be electrically connected to a gate of the second transistor, and that multilevel data be retained by retaining charge between the one of the source and the drain of the first transistor and the gate of the second transistor.

In the memory device of one embodiment of the present invention, the first transistor preferably includes a semiconductor layer containing an oxide semiconductor.

In the memory device of one embodiment of the present invention, the second transistor preferably includes a semiconductor layer containing silicon.

Note that other embodiments of the present invention will be shown in Embodiments 1 to 6 and the drawings.

One embodiment of the present invention can provide a memory device, an electronic component, an electronic device, or the like.

Another embodiment of the present invention can provide a memory device or the like with excellent multilevel data retention characteristics.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 10A and 10B are high-resolution cross-sectional TEM images of an oxide semiconductor, and FIG. 10C shows local Fourier transform images of the oxide semiconductor;

DETAILED DESCRIPTION OF THE INVENTION

Figure 1A:
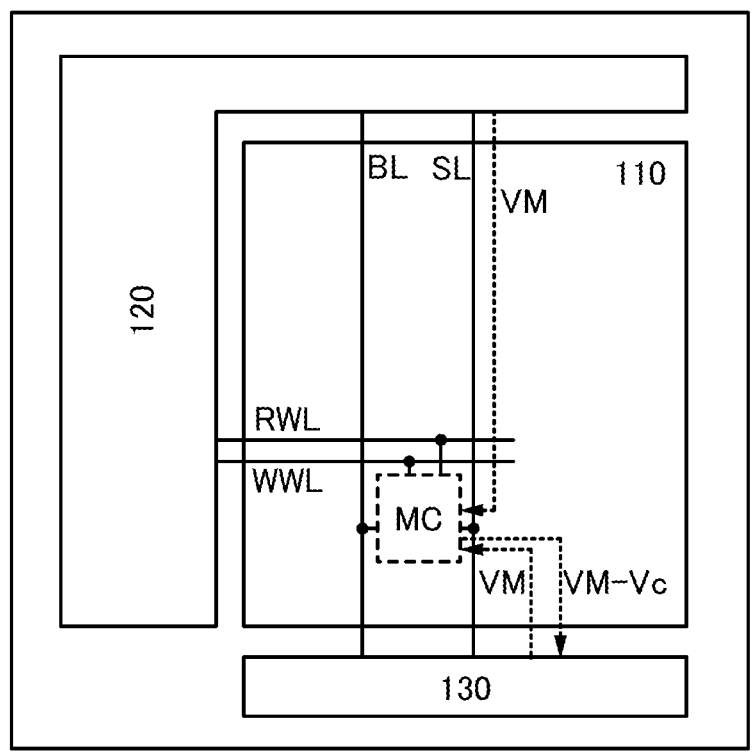
FIGS. 1A and 1B are a block diagram and a diagram showing an operation to illustrate one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, a timing chart may include variation in signal, voltage, or current due to noise or difference in timing.

In this specification and the like, a transistor is an element having at least three terminals: a gate, a drain, and a source. The transistor has a channel formation region between the drain (a drain terminal, a drain region, or a drain electrode) and the source (a source terminal, a source region, or a source electrode), and current can flow through the drain, the channel formation region, and the source.

Since the source and the drain of the transistor change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through Z1 (or not through Z1) and a drain (or a second terminal or the like) of the transistor is electrically connected to Y through Z2 (or not through Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Another example of the expression is "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path." It is also possible to use the expression "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples, and there is no limitation on the expressions. Here, X, Y, Z1, and Z2 each denote a device, an element, a circuit, a wiring, an electrode, a terminal, a conductive film, a layer, or the like.

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

In this specification, the term "parallel" indicates that an angle formed between two straight lines ranges from −10° to 10°, and accordingly also includes the case where the angle ranges from −5° to 5°.

The term "perpendicular" indicates that the angle formed between two straight lines ranges from 80° to 100°, and accordingly also includes the case where the angle ranges from 85° to 95°.

Note that the terms "film" and "layer" can be interchanged with each other depending on circumstances or situations. For example, in some cases, the term "conductive film" can be used instead of the term "conductive layer," and the term "insulating layer" can be used instead of the term "insulating film."

Embodiment 1

In this embodiment, examples of a memory device and circuits included in the memory device will be described.

In this specification and the like, a memory device means any device that can function by utilizing semiconductor characteristics; thus, a memory cell composed of semiconductor elements such as transistors, a peripheral circuit for controlling the memory cell, and a system including the memory cell and the peripheral circuit are included in the category of the memory device.

<Memory Device>

FIG. 1A illustrates a configuration example of a memory device 100 including memory cells MC.

The memory device 100 includes a memory cell array 110, peripheral circuits 120, and a refresh circuit 130. The memory cell array 110 includes a plurality of memory cells MC.

The memory cell MC included in the memory device 100 is provided with a potential corresponding to data (data potential) and has a function of retaining data by retaining charge. Data retained in the memory cell MC is multilevel data. That is, the amount of charge retained in the memory cell MC is varied to allow the memory cell MC to hold a plurality of potentials so that multilevel data is retained. Thus, if a retained potential is changed due to a change in the amount of charge, it cannot be distinguished whether read data is the original data.

The refresh circuit 130 described in this embodiment keeps the original data by adding a potential equivalent to a potential changed due to a change in charge to a read potential. Specifically, first, after writing data to a memory cell MC, a potential is read from the memory cell MC at given intervals. Next, a potential equivalent to a potential changed over time after the data writing is added to the read potential so that a refresh potential is obtained. Then, the refresh potential is written to the memory cell MC. These operations are performed in the memory device 100 including the refresh circuit 130. The memory device 100 can retain stored data even when data retained in the memory cell MC is changed due to charge transfer.

In FIG. 1A, a data potential provided from the peripheral circuits 120 to the memory cell MC is shown as a potential VM. The potential VM retained in the memory cell MC is changed in response to charge transfer, and this changed potential is shown as a potential Vc. A potential VM-Vc is a potential that is changed from VM by Vc and is read by the refresh circuit 130. The potential written to the memory cell MC from the refresh circuit 130 is VM that is the refresh potential obtained by adding Vc to VM-Vc. As described above, the refresh circuit 130 performs data refresh by generating the original data potential VM by addition of the changed potential Vc to the read potential (VM-Vc), and supplying the potential VM to the memory cell MC again.

The memory cells MC are arranged in a matrix, for example. Data writing refers to supplying a data potential to the memory cell MC. Data reading refers to taking a data potential from the memory cell MC.

The retention of a data potential is preferably performed between circuit elements, for example, at a node that connects a transistor with a capacitor. With such a configuration, data reading and writing can be controlled depending on the conduction state (on/off state) of the transistor or a current supplied to the capacitor.

A transistor for retaining a data potential preferably has a low off-state current (current that flows in the off state). With the use of a transistor having a low off-state current, the amount of charge transferred through the transistor over time can be reduced. Thus, a decrease in a data potential retained in the memory cell MC can be suppressed.

Data reading from and writing to the memory cell MC is controlled by a signal or a potential supplied to a wiring RWL, a wiring WWL, a wiring BL, and a wiring SL. The wiring RWL, the wiring WWL, the wiring BL, and the wiring SL have a function of transmitting a signal or a potential between the memory cell MC, the peripheral circuits 120, and the refresh circuit 130.

The peripheral circuit 120 has a function of controlling writing and reading of a data potential to/from the memory cell MC, and a function of controlling writing and reading of a data potential between the refresh circuit 130 and the memory cell MC. Specifically, the peripheral circuit 120 supplies a read word signal and a write word signal to the wiring RWL and the wiring WWL. Moreover, the peripheral circuit 120 supplies the data potential VM to the memory cell MC through the wiring BL and/or the wiring SL. The peripheral circuits 120 have a row decoder, a column decoder, and a shift register, for example, and supply a signal or a potential to the wiring RWL, the wiring WWL, the wiring BL, and the wiring SL.

The refresh circuit 130 has a function of supplying the memory cell MC with the potential VM (i.e., refresh potential), which is obtained by adding the potential Vc corresponding to the potential change due to charge transfer to the potential (VM-Vc) read from the memory cell MC.

Figure 1B:
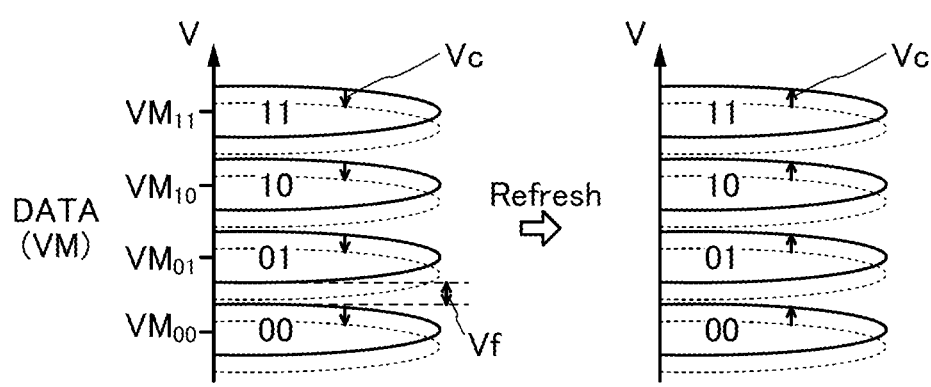

The function of the refresh circuit 130 will be described with reference to FIG. 1B. FIG. 1B shows four-level data potentials $VM_{00}$, $VM_{01}$, $VW_{10}$, and $VM_{11}$ as examples of the data potential VM, which respectively correspond to data 00, 01, 10, and 11.

The data potentials are distributed as shown in FIG. 1B. The distribution of the original data potentials represented by solid lines varies with time and changes to a distribution represented by dotted lines. The potential change can be represented by the potential Vc.

Note that the distribution of the data potentials represents a variation in the data potentials corresponding to each data. A potential difference Vf represents a difference between the maximum value and the minimum value immediately after the data writing, which are respectively taken by neighboring two data potentials.

The data refresh operation performed by the refresh circuit 130 in FIG. 1A is carried out before the potential Vc exceeds the potential difference Vf. With the data refresh operation, the potential Vc is added to the data potentials represented by dotted lines, whereby the data potential retained in the memory cell MC can be refreshed to reproduce the original data potential.

As described above, the memory device in this embodiment includes the refresh circuit 130, whereby a data potential retained in the memory cell MC can be refreshed to the original data potential even if it is changed by charge transfer. Thus, data written to the memory cell MC can be retained.

<Memory Cell>

Next, an example of the memory cell MC will be described in detail.

Figure 2:
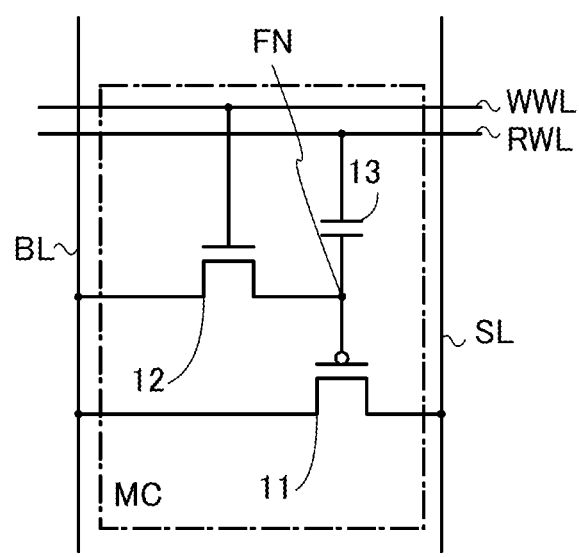
FIG. 2 is a circuit diagram illustrating one embodiment of the present invention.

FIG. 2 illustrates an example of a circuit configuration of the memory cell MC. The memory cell MC includes a transistor 11, a transistor 12, and a capacitor 13.

One of a source and a drain of the transistor 11 is connected to the wiring BL. The other of the source and the drain of the transistor 11 is connected to the wiring SL. A gate of the transistor 11 is connected to one of a source and a drain of the transistor 12.

The one of the source and the drain of the transistor 12 is connected to the gate of the transistor 11. The other of the source and the drain of the transistor 12 is connected to the wiring BL. A gate of the transistor 12 is connected to the wiring WWL.

One electrode of the capacitor 13 is connected to the gate of the transistor 11. The other electrode of the capacitor 13 is connected to the wiring RWL.

In the memory cell MC illustrated in FIG. 2, the transistor 12 is an OS transistor and the transistor 11 is a Si transistor. In this structure, the Si transistor and the OS transistor can be stacked, whereby the layout area of the memory cell can be reduced. In the following description, the transistor 11 is a p-channel transistor and the transistor 12 is an n-channel transistor.

In the memory cell MC in FIG. 2, a node FN refers to a node where the transistor 11, the transistor 12, and the capacitor 13 are connected. The node FN retains charge corresponding to a data potential by turning off the transistor 12.

An OS transistor used as the transistor 12 has ultralow off-state current characteristics. Accordingly, charge transfer through the transistor 12 can be reduced, and the potential change Vc due to the charge transfer can be reduced.

Next, an operation example of the memory cell MC will be described.

Figure 3A:
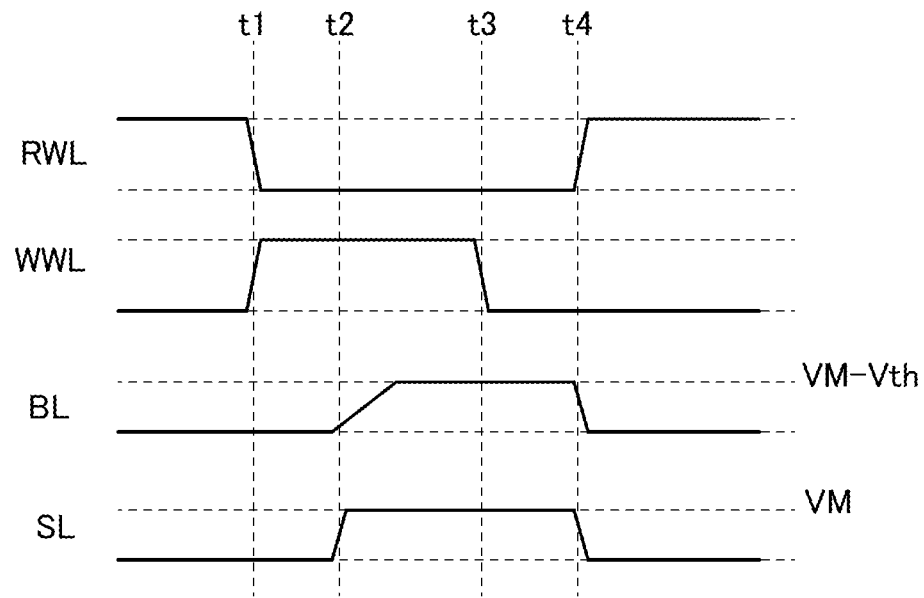
FIGS. 3A and 3B are timing charts illustrating one embodiment of the present invention.

First, an example of the operation for writing the data potential VM is described. FIG. 3A shows a timing chart.

First, at time t1, a read word signal transmitted to the wiring RWL is set to L level, and a write word signal transmitted to the wiring WWL is set to H level. Thus, the transistor 11 and the transistor 12 are turned on.

Next, at time t2, the data potential VM is transmitted to the wiring SL. Since the transistor 11 is on, a potential (VM-Vth) that is lower than the potential VM of the wiring SL by the threshold voltage (Vth) of the transistor 11 is transmitted to the wiring BL through the transistor 11. Since the transistor 12 is on, the potential (VM-Vth) of the wiring BL is transmitted to the node FN through the transistor 12.

Then, at time t3, the write word signal transmitted to the wiring WWL is set to L level. Thus, the transistor 12 is turned off, whereby charge corresponding to the potential (VM-Vth) is retained at the node FN. That is, the data potential is written to the memory cell MC.

Subsequently, at time t4, the read word signal transmitted to the wiring RWL is set to H level. The node FN is electrically floating because the transistor 12 is off. Accordingly, the potential of the node FN rises with the increase in the potential of the wiring RWL. The increase in the potential of the node FN turns off the transistor 11. Furthermore, the potentials of the wiring BL and the wiring SL are set to L level.

Figure 4A:
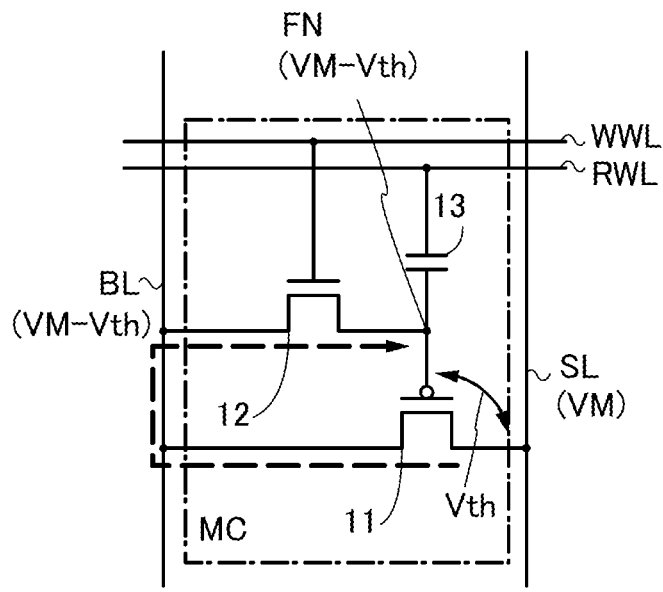
FIGS. 4A and 4B are circuit diagrams illustrating one embodiment of the present invention.

Writing of a data potential to the memory cell MC is schematically shown in a circuit diagram of FIG. 4A. A dotted arrow in FIG. 4A indicates the flow of charge at the time of writing a data potential to the memory cell MC.

Figure 3B:
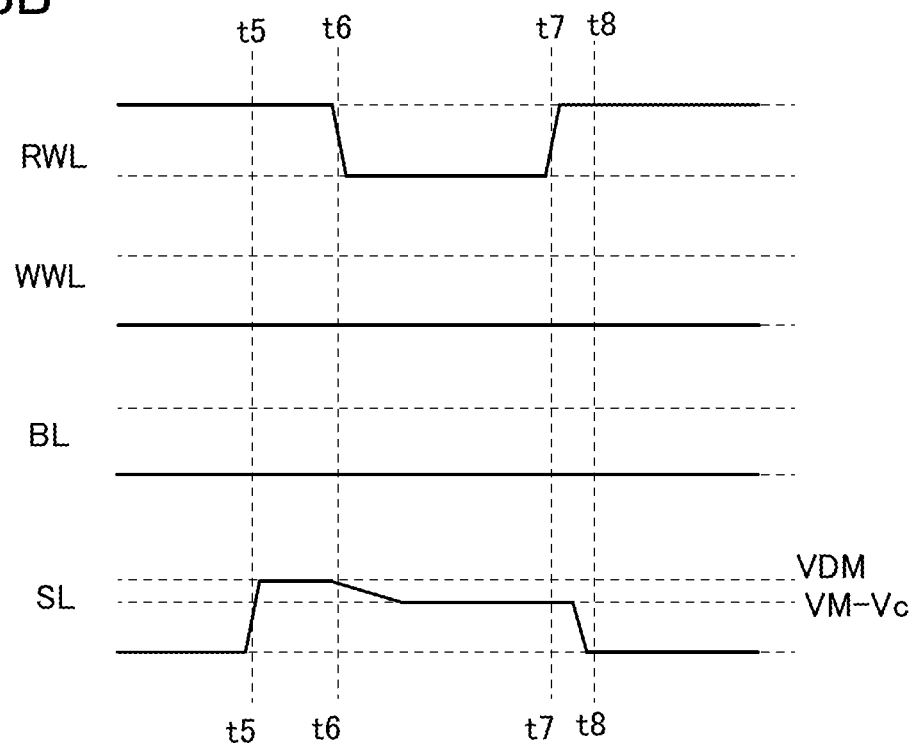

Next, an example of the operation for reading the data potential VM is described. FIG. 3B shows a timing chart. The following description is made assuming that, at the time of reading the data potential, the potential (VM−Vth) written to the node FN has been reduced and changed to a potential (VM−Vth−Vc) by the charge transfer.

First, at time t5, the wiring SL is precharged at a potential VDM to read the potential (VM−Vth−Vc) retained at the node FN.

Then, at time t6, the read word signal transmitted to the wiring RWL is set to L level. The node FN is electrically floating because the transistor 12 is off. Accordingly, the potential of the node FN is decreased with the decrease in the potential of the wiring RWL. The decrease in the potential of the node FN turns on the transistor 11. Thus, the potential of the wiring SL changes from the precharged potential VDM to the potential (VM−Vc). That is, the data potential (VM−Vc) is read and transferred to the wiring SL.

In the read operation, the threshold voltage Vth of the transistor 11 is canceled when the potential (VM−Vth−Vc) retained at the node FN becomes the potential (VM−Vc) to be read and transferred to the wiring SL. Thus, the read data potential is less likely to be affected by a variation in threshold voltage of the transistor 11. Consequently, the distribution of data potentials is narrowed, and the potential difference Vf can be increased.

Next, at time t7, the read word signal transmitted to the wiring RWL is set to H level. The node FN is electrically floating because the transistor 12 is off. Accordingly, the potential of the node FN rises with the increase in the potential of the wiring RWL. The increase in the potential of the node FN turns off the transistor 11.

Then, at time t8, the potential of the wiring SL is changed from the read potential (VM−Vc) to L level.

Figure 4B:
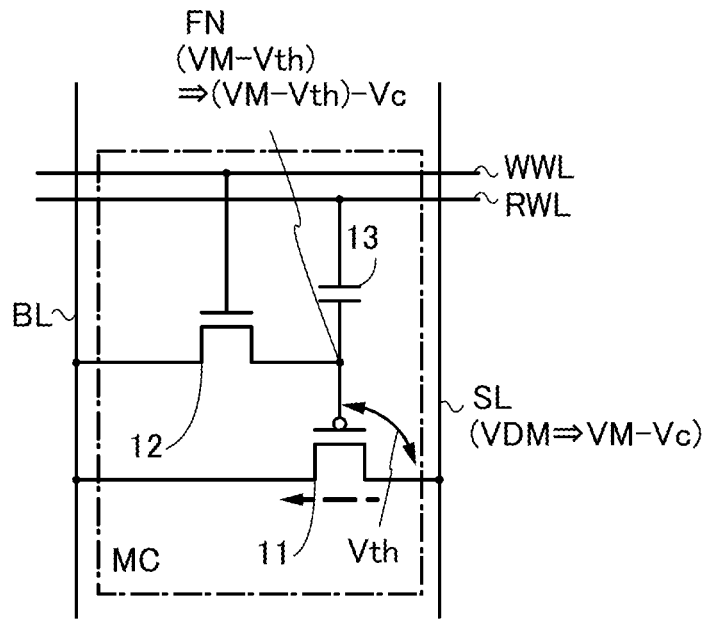

Reading of a data potential from the memory cell MC is schematically shown in a circuit diagram of FIG. 4B. A dotted arrow in FIG. 4B indicates the flow of charge at the time of reading a data potential from the memory cell MC.

As described above, the memory cell MC included in the memory device of this embodiment can have a narrow distribution of the data potentials and a large potential difference Vf. Thus, it is possible to allow the potential VC to be increased. As a result, the interval between refresh operations can be increased.

<Refresh Circuit>

Figure 5:
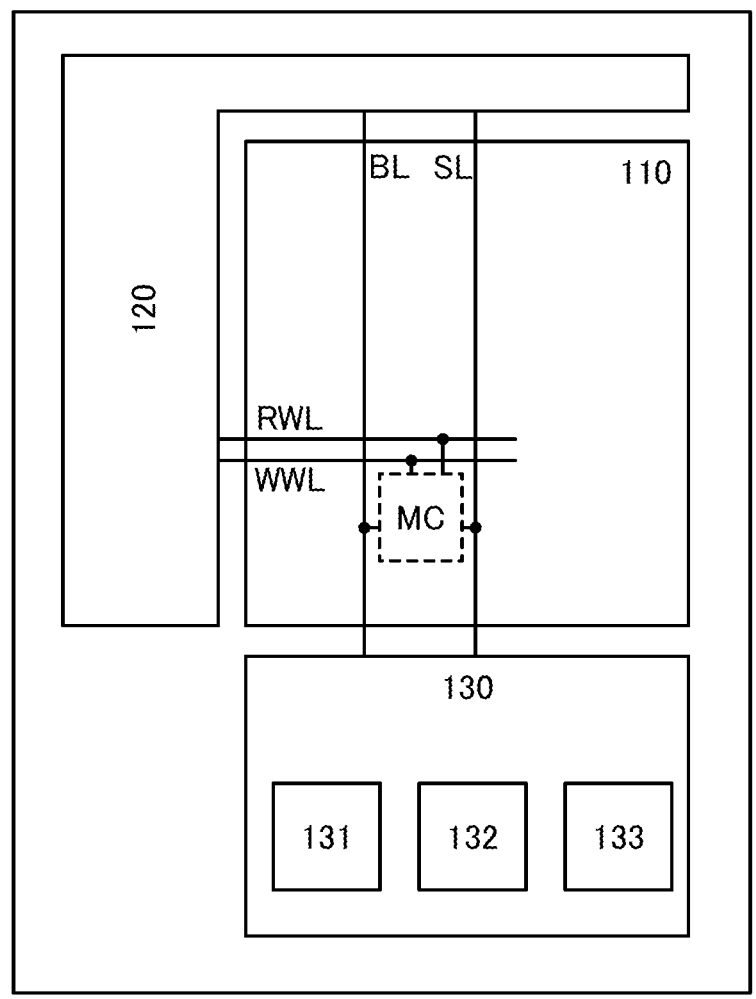
FIG. 5 is a block diagram illustrating one embodiment of the present invention.

In a block diagram of FIG. 5, the refresh circuit in the block diagram of FIG. 1A is divided into blocks according to their functions. In the block diagram of FIG. 5, the refresh circuit 130 includes a refresh timing control circuit 131, a compensation voltage generator circuit 132, and a voltage adder circuit 133.

The refresh timing control circuit 131 has a function of controlling the interval between operations for refreshing a data potential retained in the memory cell.

Figure 6A:
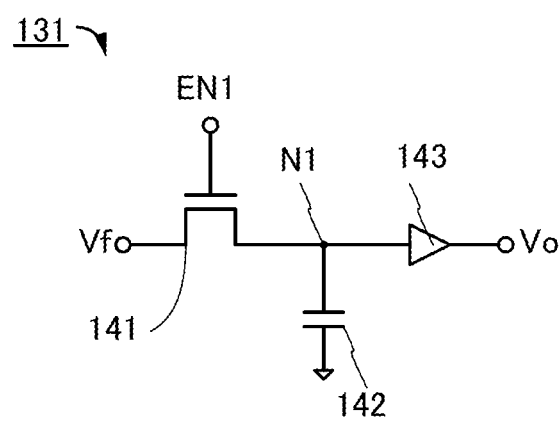
FIGS. 6A to 6C are a circuit diagram, a timing chart, and a diagram showing an operation to illustrate one embodiment of the present invention.

FIG. 6A illustrates a configuration example of the refresh timing control circuit 131. The refresh timing control circuit 131 includes a transistor 141, a capacitor 142, and a buffer 143.

The transistor 141 preferably has the same characteristics as the transistor 12 included in the memory cell MC. For example, when the transistor 12 in the memory cell MC is an OS transistor, the transistor 141 is preferably an OS transistor.

The capacitor 142 is provided to retain charge at a node N1. The capacitor 142 can be omitted when the gate capacitance and parasitic capacitance of the buffer 143 are sufficiently large.

The buffer 143 has a function of outputting the potential of the node N1 as a binary signal. As the buffer 143, two inverters can be provided in series, for example.

A reference potential is supplied to the node N1 between the transistor 141 and the buffer 143. As the reference potential, a potential Vf whose difference from a ground potential corresponds to the potential difference Vf can be supplied.

The potential Vf is written to the node N1 by a signal EN1 supplied to a gate of the transistor 141. The written potential Vf is retained by turning off the transistor 141. Charge at the node N1 is transferred through the transistor 141 as in the memory cell MC; therefore, the potential of the node N1 decreases gradually.

Figure 6B:
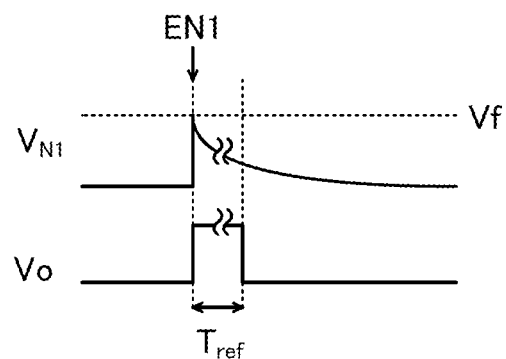

The change in potential retained at the node N1 is described with reference to FIG. 6B. In FIG. 6B, the change in potential of the node N1 is denoted by a signal $V_{N1}$, and an output of the buffer 143 is denoted by a signal Vo.

As shown in FIG. 6B, the potential of the signal $V_{N1}$ decreases after the potential Vf is written by the signal EN1. With the decrease in potential of the signal $V_{N1}$, the input potential of the buffer 143 decreases. When the input potential of the buffer 143 falls below the threshold value of the inverters, its output potential changes from a high potential to a low potential. A period Tref refers to a period after the potential Vf is written before the output potential of the buffer 143 is changed. The period Tref corresponds to an interval between refresh operations.

After the period Tref is obtained, the reference potential is supplied again to the node N1 and the period Tref is set.

The period Tref is set for each data potential writing or refresh operation. In the refresh operation, a data potential is read from the memory cell MC and subjected to a refresh operation, and the refreshed data potential is written. In the data potential writing, a new data potential is written to the memory cell MC by controlling the peripheral circuits 120.

Figure 6C:
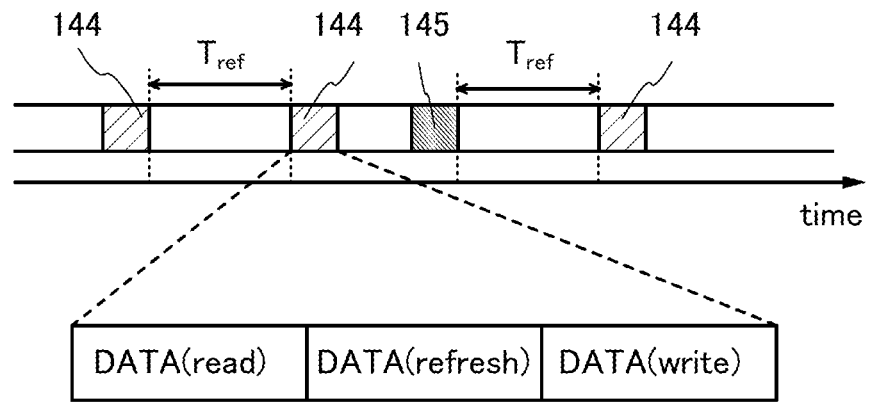

A series of operations set by the period Tref can be performed as shown in FIG. 6C. For example, assuming that a refresh operation is performed in a period 144 and a data potential is written in a period 145, the period Tref is set to start immediately after each operation and a refresh operation are performed after the period Tref.

As described above, in the period 144, a data potential is read from the memory cell MC and subjected to a refresh operation, and the refreshed data potential is written. The data potential fresh corresponds to an operation of adding a potential equivalent to the amount of potential decrease of data to be refreshed.

The compensation voltage generator circuit 132 has a function of estimating the potential Vc equivalent to a potential that is decreased from a data potential retained in the memory cell MC by charge transfer.

Figure 7A:
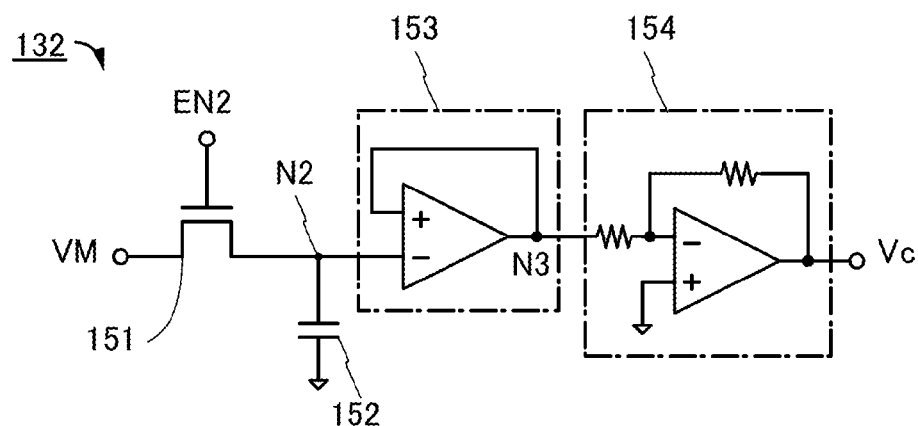
FIGS. 7A and 7B are a circuit diagram and a diagram showing an operation to illustrate one embodiment of the present invention.

FIG. 7A illustrates a configuration example of the compensation voltage generator circuit 132. The compensation voltage generator circuit 132 includes a transistor 151, a capacitor 152, a voltage follower 153, and an inverting amplifier 154.

The transistor 151 preferably has the same characteristics as the transistor 12 included in the memory cell MC. For example, when the transistor 12 in the memory cell MC is an OS transistor, the transistor 151 is preferably an OS transistor.

The capacitor 152 is provided to retain charge at a node N2. The capacitor 152 can be omitted when the gate capacitance and parasitic capacitance of the voltage follower 153 are sufficiently large.

The voltage follower 153 and the inverting amplifier 154 have a function of inverting a change in potential of the node N2 and outputting the inverted potential.

The node N2 between the transistor 151 and the voltage follower 153 is supplied with a data potential or one of data potentials in the case of multilevel data; the data potential is shown as VM in FIG. 7A.

The data potential VM is written to the node N2 by a signal EN2 supplied to a gate of the transistor 151. The written data potential VM is retained by turning off the transistor 151. Charge at the node N2 is transferred through the transistor 151 as in the memory cell MC; therefore, the potential of the node N2 decreases gradually.

Figure 7B:
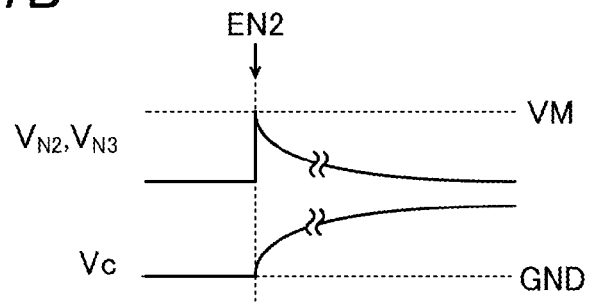

The change in potential retained at the node N2 is described with reference to FIG. 7B. In FIG. 7B, the changes in potentials of the node N2 and a node N3 are denoted by a signal $V_{N2}$ and a signal $V_{N3}$, respectively, and an output of the inverting amplifier 154 is denoted by a signal Vc.

As shown in FIG. 7B, the potentials of the signals $V_{N2}$ and $V_{N3}$ decrease after the data potential VM is written by the signal EN2. With the decrease of the potentials of the signals $V_{N2}$ and $V_{N3}$, the output potential of the inverting amplifier 154 increases. The output potential of the inverting amplifier 154, which increases inversely with the decrease of the input potential, can be used as the potential Vc.

The voltage adder circuit 133 has a function of supplying the wiring SL with the potential VM, which is obtained by adding the potential Vc estimated by the compensation voltage generator circuit 132 to the potential (VM-Vc) read from the memory cell MC, and writing the potential VM to the memory cell MC.

Figure 8A:
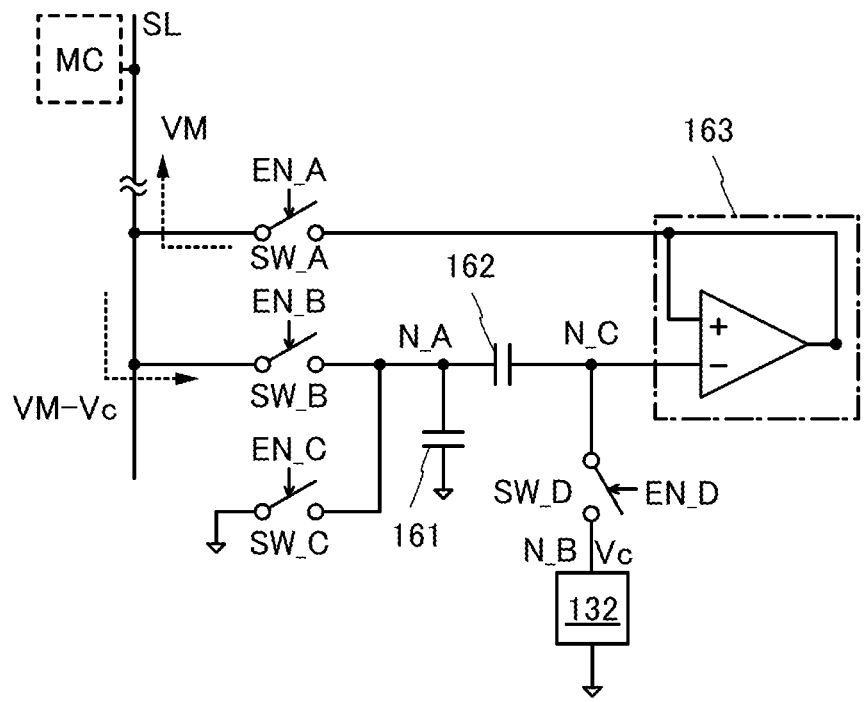
FIGS. 8A and 8B are a circuit diagram and a diagram showing an operation to illustrate one embodiment of the present invention.

FIG. 8A illustrates a capacitor 161, a capacitor 162, switches SW_A to SW_D, and a voltage follower 163, and the compensation voltage generator circuit 132. The on/off states of the switches SW_A to SW_D are controlled with respective control signals EN_A to EN_D. The following explanation is made for the case where one of the terminals of the switch SW_C is connected to a fixed potential line, e.g., a ground line.

The capacitor 161 is provided to retain charge at a node N_A.

The capacitor 162 is provided to add a potential equivalent to the increase in potential of the node N_A to a node N_C.

As the switches SW_A to SW_D, transistors can be used, in which case OS transistors are preferably used. When OS transistors are used as the switches, charge retention characteristics of each node can be favorable. Note that the description is made for the case where the switches SW_A to SW_D each are n-channel-type OS transistors. That is, when the control signals EN_A to EN_D are each H level, the switches SW_A to SW_D each exist in an electrically conductive state, while they are each in an electrically disconnected state when the control signals EN_A to EN_D are each L level.

Figure 8B:
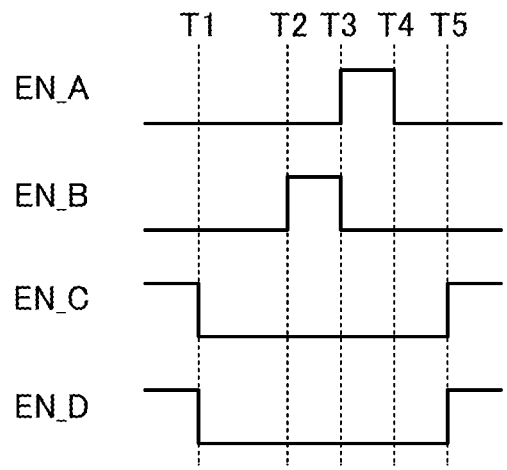

Using a timing chart in FIG. 8B, the description is made on control of the switches SW_A to SW_D for a refresh operation to obtain the potential VM (the original data potential) by adding the potential Vc that is the equivalent of the potential decrease to the data potential (VM-Vc) which is decreased by charge transfer. FIG. 8B shows the control signals EN_A to EN_D.

At time T1, the control signals EN_C and EN_D are switched from H level to L level. Thus, the switches SW_C and SW_D are turned off. Electrical continuity between the node N_A and a ground line is broken, and electrical continuity between the node N_C and a node N_B is broken. At this time, the node N_A and the node N_C become electrically floating. Consequently, a ground potential is retained at the node N_A, and the potential Vc is retained at the node N_C.

Next, at time T2, the control signal EN_B is set to H level. Thus, the switch SW_B is turned on, and the potential (VM-Vc) read and transferred to the wiring SL is supplied to the node N_A. At this time, the node N_C is electrically floating. Accordingly, as the potential of the node N_A is increased by supplying the potential (VM-Vc) to the node N_A, capacitive coupling occurs through the capacitor 162, and the potential of the node N_C also rises. The potential of the node N_C increases such that the potential (VM-Vc) is added to the potential Vc, which is initially retained. As a result, the potential of the node N_C becomes the potential VM where the potential Vc is canceled.

Then, at time T3, the control signal EN_B is set to L level and the control signal EN_A is set to H level. Thus, the switch SW_A is turned on and the switch SW_B is turned off. Electrical continuity is established between the wiring SL and an output terminal of the voltage follower 163. Accordingly, the output potential of the voltage follower 163, that is, the potential VM at the node N_C is supplied to the wiring SL. The potential VM (i.e., refresh potential) at the node N_C supplied to the wiring SL is written to the memory cell MC by the operation of the peripheral circuits 120.

Then, at time T4, the control signal EN_A is set to L level, and electrical continuity between the wiring SL and the output terminal of the voltage follower 163 is broken. Subsequently, at time T5, the control signals EN_C and EN_D are switched from L level to H level, and the node N_A is set to a ground potential and the node N_C is set to the potential Vc.

The above-described memory device including the refresh circuit can keep the original data by adding a potential equivalent to the potential changed due to a change in charge to a read potential. The refresh circuit includes a refresh timing control circuit, a compensation voltage generator circuit, and a voltage adder circuit and refreshes a data potential. The refresh timing control circuit controls the interval between refresh operations and reads a data potential from the memory cell MC at regular intervals. Since the read data potential varies in response to charge transfer, the compensation voltage generator circuit estimates the potential Vc corresponding to the potential change. Then, the voltage adder circuit generates a potential corresponding to the original data by adding the potential Vc to the data potential read from the memory cell MC and writes the generated potential to the memory cell MC. Consequently, even if the memory device is configured to maintain multilevel data by using a plurality of potential distributions, the data can be retained in spite of the charge transfer.

Note that the structures, methods, and the like described in this embodiment can be used as appropriate in combination with any of the structures, methods, and the like described in the other embodiments.

Embodiment 2

This embodiment will show variation examples of a circuit configuration of the memory cell MC described in Embodiment 1.

FIGS. 9A to 9D illustrate variation examples of a circuit configuration that the memory cell MC described in Embodiment 1 can have.

Figure 9A:
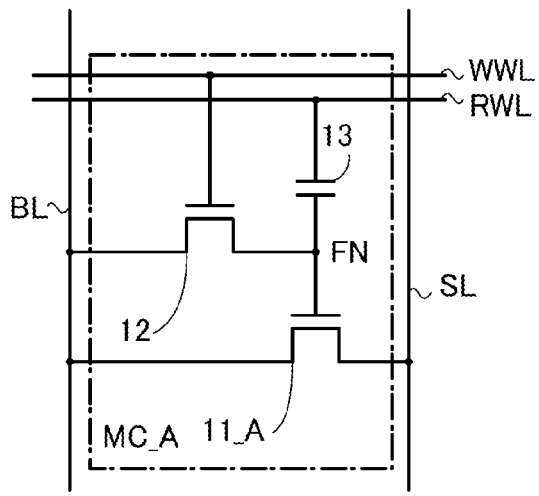
FIGS. 9A to 9D are circuit diagrams each illustrating one embodiment of the present invention.

A memory cell MC_A illustrated in FIG. 9A includes a transistor 11_A, the transistor 12, and the capacitor 13. The transistor 11_A is an n-channel transistor. The configuration in FIG. 9A can be applied to the memory cell MC in Embodiment 1.

Figure 9B:
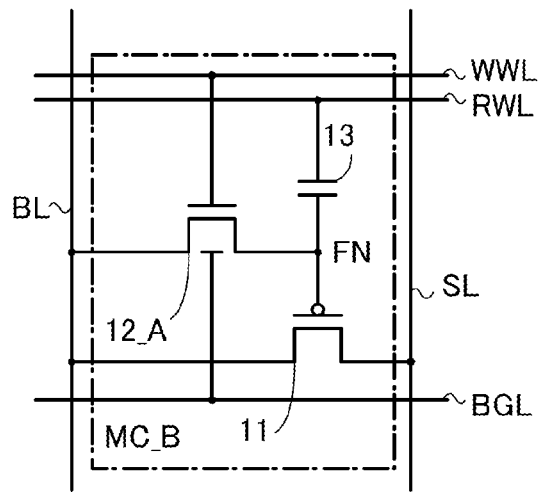

A memory cell MC_B illustrated in FIG. 9B includes the transistor 11, a transistor 12_A, and the capacitor 13. The transistor 12_A has a back gate that is controlled with a wiring BGL. This configuration enables control of the threshold voltage of the transistor 12_A. The configuration in FIG. 9B can be applied to the memory cell MC in Embodiment 1.

Figure 9C:
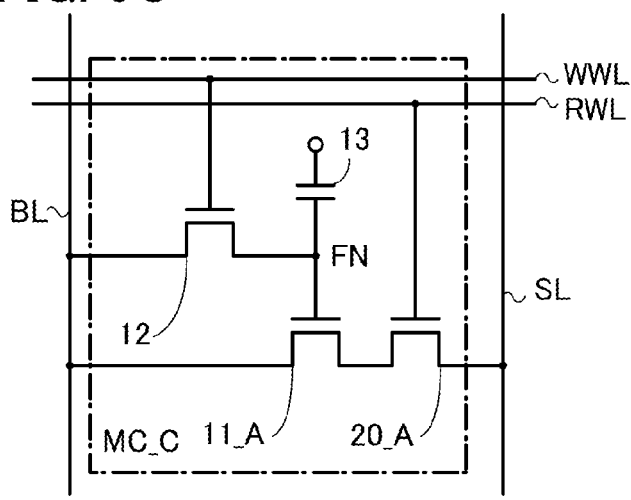

A memory cell MC_C illustrated in FIG. 9C includes the transistor 11_A, the transistor 12, the capacitor 13, and a transistor 20_A. The transistor 20_A is an n-channel transistor like the transistor 11_A. The configuration in FIG. 9C can be applied to the memory cell MC in Embodiment 1.

Figure 9D:
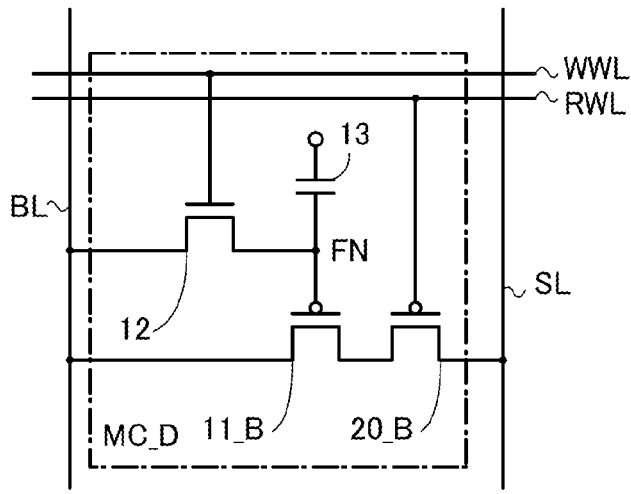

A memory cell MC_D illustrated in FIG. 9D includes a transistor 11_B, the transistor 12, the capacitor 13, and a transistor 20_B. The transistor 11_B and the transistor 20_B are p-channel transistors. The configuration in FIG. 9D can be applied to the memory cell MC in Embodiment 1.

Note that the structures, methods, and the like described in this embodiment can be used as appropriate in combination with any of the structures, methods, and the like described in the other embodiments.

Embodiment 3

This embodiment will explain an OS transistor with a low off-state current that is shown in Embodiment 1 and an oxide semiconductor contained in a semiconductor layer of the OS transistor.

<OS Transistor>

An OS transistor shown as a transistor with a low off-state current in Embodiment 1 exhibits lower off-state current than a Si transistor.

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1\times10^{17}/cm^3$, lower than $1\times10^{15}/cm^3$, or lower than $1\times10^{13}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultra-low off-state current.

For example, the OS transistor with reduced off-state current can exhibit an off-state current per micrometer in channel width of $1\times10^{-18}$ A or less, $1\times10^{-21}$ A or less, or $1\times10^{-24}$ A or less at room temperature (approximately 25° C.), or $1\times10^{-15}$ A or less, $1\times10^{-18}$ A or less, or $1\times10^{-21}$ A or less at 85° C.

Here, the off-state current of an n-channel transistor is a current that flows between a source and a drain when the transistor is off. Specifically, the off-state current of an n-channel transistor refers to a current that flows between a source and a drain when a voltage less than a threshold voltage is applied between a gate and the source.

Therefore, the memory cell MC can retain charge at the node FN by turning off the OS transistor 12.

The OS transistor included in the memory cell MC can have favorable switching characteristics as well as a low off-state current.

The OS transistor included in the memory cell MC may be formed on an insulating surface. In this case, unlike in a Si transistor using a semiconductor substrate as a channel formation region, parasitic capacitance is not generated between a gate electrode and a body or a semiconductor substrate. Consequently, with the use of the OS transistor, carriers can be controlled easily with a gate electric field, and favorable switching characteristics are obtained.

<Oxide Semiconductor>

Next, an oxide semiconductor that can be used for a semiconductor layer of the OS transistor will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding with oxygen is preferably contained in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, or 2:1:3 or close thereto. It is particularly preferable to use an In—Ga—Zn-based oxide with an atomic ratio of In:Ga:Zn=4:2:3 or close thereto. An oxide semiconductor film of an In—Ga—Zn-based oxide with an atomic ratio of In:Ga:Zn=4:2:3 or close thereto is formed using a target with an atomic ratio of In:Ga:Zn=4:2:4.1.

If an oxide semiconductor film forming the semiconductor layer contains hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is conceivably reduced by the dehydration treatment (dehydrogenation treatment). For this reason, it is preferred that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment. Moreover, treatment for making the oxygen content of an oxide semiconductor film in excess of that in the stoichiometric composition may be expressed as treatment for providing an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be transformed to an i-type (intrinsic) oxide semiconductor film or a substantially i-type (intrinsic) oxide semiconductor film that is extremely close to an i-type oxide semiconductor film.

A structure of the oxide semiconductor film is described below.

An oxide semiconductor film is classified broadly into a single-crystal oxide semiconductor film and a non-single-crystal oxide semiconductor film. The non-single-crystal oxide semiconductor film includes a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film having a plurality of c-axis aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

FIG. 10A is a high-resolution cross-sectional TEM image of a CAAC-OS film. FIG. 10B is a high-resolution cross-sectional TEM image obtained by enlarging the image of FIG. 10A. In FIG. 10B, atomic arrangement is highlighted for easy understanding.

FIG. 10C shows Fourier transform images of regions each surrounded by a circle (with a diameter of approximately 4 nm) between A and O and between O and A' in FIG. 10A. C-axis alignment can be observed in each region in FIG. 10C. The c-axis direction between A and O is different from that between O and A', which indicates that a grain in the region between A and O is different from that between O and A'. In addition, between A and O, the angle of the c-axis changes gradually and continuously from 14.3° to 16.6° to 26.4°. Similarly, between O and A', the angle of the c-axis changes gradually and continuously from −18.3° to −17.6° to −15.9°.

In an electron diffraction pattern of the CAAC-OS film, spots (bright spots) indicating crystal alignment are shown. For example, when electron diffraction with an electron beam having a diameter of 1 nm to 30 nm (such electron diffraction is also referred to as nanobeam electron diffraction) is performed on the top surface of the CAAC-OS film, spots are observed (see FIG. 11A).

The high-resolution cross-sectional TEM image and the high-resolution plan-view TEM image show that alignment is found in the crystal parts of the CAAC-OS film.

Most of the crystal parts included in the CAAC-OS film each fit inside a cube whose one side is less than 100 nm. Thus, the CAAC-OS film also includes crystal parts which fit inside a cube with a side of less than 10 nm, less than 5 nm, or less than 3 nm. Note that when a plurality of crystal parts included in the CAAC-OS film are connected to each other, one large crystal region may be formed. Hence, a crystal region with an area of 2500 nm$^2$ or more, 5 μm$^2$ or more, or 1000 μm$^2$ or more can be observed in the high-resolution plan-view TEM image.

When a CAAC-OS film, e.g., a CAAC-OS film including an InGaZnO$_4$ crystal, is subjected to structural analysis by an out-of-plane method with an X-ray diffraction (XRD) apparatus, a peak appears at a diffraction angle (2 θ) of 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears at 2 θ of 56°. This peak is derived from the (110) plane of the InGaZnO$_4$ crystal. When an analysis (φ scan) is performed on a single-crystal oxide semiconductor film of InGaZnO$_4$ under conditions where the sample is rotated about a normal vector of a sample surface as an axis (φ axis) with 2 θ fixed at 56°, six peaks are observed. The six peaks are derived from crystal planes equivalent to the (110) plane. On the other hand, in the case of a CAAC-OS film, a peak is not clearly observed when φ scan is performed with 2 θ fixed at 56°.

According to the above results, it has been concluded that in the CAAC-OS film, while the directions of the a-axes and b-axes are irregularly arranged between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed when an oxide semiconductor film is formed or subjected to crystallization treatment such as heat treatment. As described above, the c-axis of the crystal is aligned in a direction parallel to a normal vector of a formation surface or a normal vector of a top surface. Thus, for example, when the shape of the CAAC-OS film is changed by etching or the like, the c-axis of the crystal might not be necessarily parallel to a normal vector of a normal vector of a top surface of the CAAC-OS film.

Distribution of the c-axis aligned crystal parts in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface may be higher than that in the vicinity of the formation surface. Moreover, when an impurity is added to the CAAC-OS film, a region to which the impurity is added is transformed, and the proportion of the c-axis aligned crystal parts in the CAAC-OS film may vary depending on regions.

When the CAAC-OS film with an InGaZnO$_4$ crystal is analyzed by an out-of-plane method, a peak may also be observed at 2 θ of 36° as well as at 2 θ of 31°. The peak at 2 θ of 36° indicates that a crystal having no c-axis alignment is included in the CAAC-OS film. It is preferred that in the CAAC-OS film, a peak appear at 2 θ of 31° and a peak not appear at 2 θ of 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by abstracting oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity. The impurity contained in the oxide semiconductor film readily serves as a carrier trap or a carrier generation source.

The CAAC-OS film is an oxide semiconductor film having a low density of defect states. Oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Electric charge trapped by the carrier traps in the oxide semiconductor film requires a long time to be released and might behave like fixed electric charge. Thus, the transistor including an oxide semiconductor film having high impurity concentration and a high density of defect states has unstable electrical characteristics.

With the use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film ranges from 2 nm to 300 nm, from 3 nm to 100 nm, or from 5 nm to 50 nm in the high-resolution TEM image, for example. Moreover, in the high-resolution TEM image of the polycrystalline oxide semiconductor film, a grain boundary is observed.

The polycrystalline oxide semiconductor film includes a plurality of crystal grains, and alignment of crystals is different in the plurality of crystal grains. When the polycrystalline oxide semiconductor film including an $InGaZnO_4$ crystal is analyzed by an out-of-plane method with an XRD apparatus, other peaks appear in addition to the peaks at 2 θ of 31° and 36°.

The polycrystalline oxide semiconductor film has high crystallinity and thus has high electron mobility. Accordingly, a transistor including the polycrystalline oxide semiconductor film has high field-effect mobility. Note that in the polycrystalline oxide semiconductor film, an impurity is readily segregated at a grain boundary. The grain boundary of the polycrystalline oxide semiconductor film becomes a defect state. Since the grain boundary of the polycrystalline oxide semiconductor film is able to serve as a carrier trap or a carrier generation source, a transistor including the polycrystalline oxide semiconductor film is likely to have larger variation in electrical characteristics and lower reliability than a transistor including a CAAC-OS film.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary is not always found clearly.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, in a nanobeam electron diffraction pattern of the nc-OS film obtained by using an electron beam having a probe diameter close to or smaller than the diameter of a crystal part, a plurality of circumferentially distributed spots are observed (see FIG. 11B).

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Consequently, the nc-OS film has a higher carrier density than the CAAC-OS film. The oxide semiconductor film with a high carrier density has high electron mobility. Thus, a transistor including the nc-OS film can have high field-effect mobility. Furthermore, the nc-OS film has a higher defect state density than the CAAC-OS film, and thus has a large number of carrier traps. Therefore, a transistor including the nc-OS film has larger variation in electrical characteristics and lower reliability than a transistor including the CAAC-OS film. Note that the nc-OS film can be formed easily as compared to the CAAC-OS film because nc-OS film can be formed even when a relatively large amount of impurities are included; thus, depending on the purpose, the nc-OS film can be favorably used. Therefore, a memory device using the transistor including the nc-OS film can be manufactured with high productivity.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

The amorphous oxide semiconductor film is an oxide semiconductor film that contains impurities such as hydrogen at a high concentration and has a high density of defect states.

The oxide semiconductor film with a high impurity concentration and a high density of defect states has a large number of carrier traps or carrier generation sources.

Accordingly, the amorphous oxide semiconductor film has a much higher carrier density than the nc-OS film. Therefore, a transistor including the amorphous oxide semiconductor film tends to have normally-on characteristics; thus, the amorphous oxide semiconductor layer can be used for a transistor that needs to be normally on. Since the amorphous oxide semiconductor film has a high density of defect states, it has an increased number of carrier traps. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a low impurity concentration and a low density of defect states (few oxygen vacancies), and thus has a low carrier density. Accordingly, a transistor including the single-crystal oxide semiconductor film is unlikely to have normally-on characteristics. Moreover, the single-crystal oxide semiconductor film has a low impurity concentration and a low density of defect states, and thus, has few carrier traps. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void is observed. Furthermore, in the high-resolution TEM image, there are a region where a crystal part is clearly observed and a region where a crystal part is not observed. In the amorphous-like OS film, crystallization is induced by the weak electron beam used for TEM observation, resulting in the growth of the crystal part. In contrast, crystallization is scarcely observed in the nc-OS film when the electron-beam irradiation is carried out at a low intensity as in the TEM observation.

Figure 12:
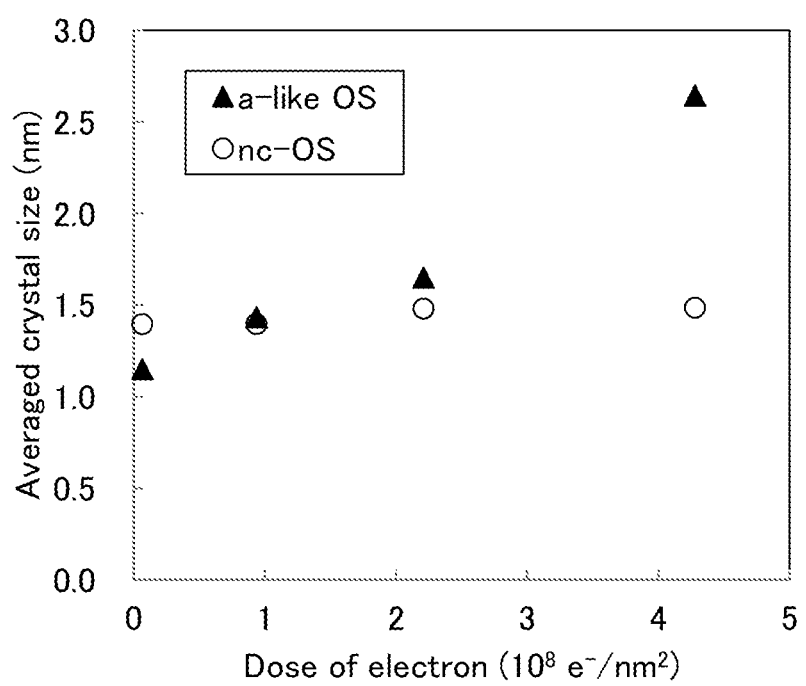
FIG. 12 shows a change in crystal parts by electron irradiation.

FIG. 12 shows experimental results of change in average size of crystal parts (20 to 40 points) in the amorphous-like OS film and the nc-OS film using high-resolution TEM images. From FIG. 12, it is understood that the crystal part size in the amorphous-like OS film increases with an increase of the total amount of electron irradiation. Specifically, the crystal part of approximately 1.2 nm at the start of TEM observation grows to a size of approximately 2.6 nm at the total dose of electron irradiation of $4.2\times10^8$ e$^-$/nm$^2$. In contrast, the crystal part size in the nc-OS film shows negligible change from the start of electron irradiation to the total dose of electron irradiation of $4.2\times10^8$ e$^-$/nm$^2$.

Furthermore, by linear approximation of the change in the crystal part size in the amorphous-like OS film and the nc-OS film and extrapolation to the total amount of electron irradiation of 0 e$^-$/nm$^2$, the average size of the crystal part is found to be a positive value. This suggests that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

When the oxide semiconductor film has a plurality of structures, the structures can be analyzed using nanobeam electron diffraction.

Figure 11A:
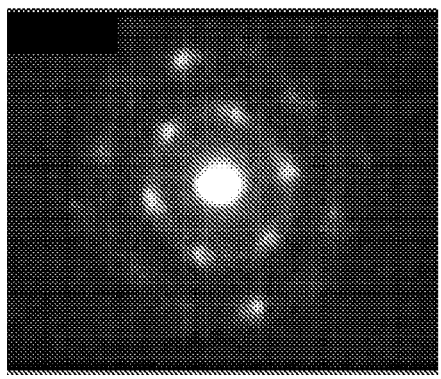
FIGS. 11A and 11B show nanobeam electron diffraction patterns of oxide semiconductor films.
Figure 11B:
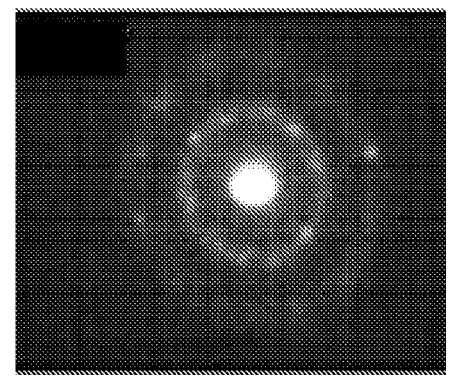
Figure 11C:
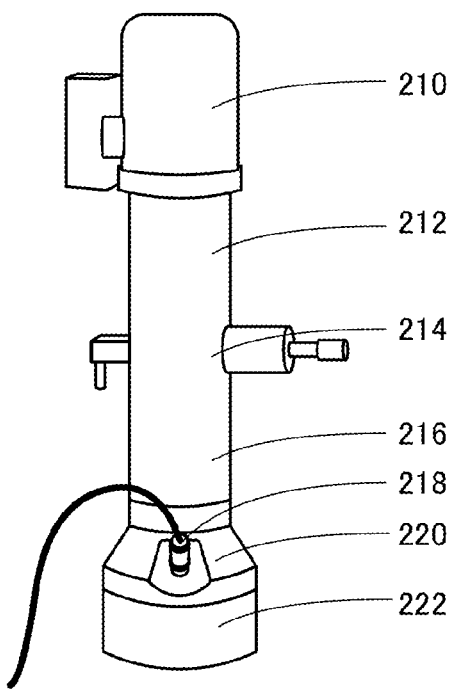
FIGS. 11C and 11D illustrate an example of a transmission electron diffraction measurement apparatus.

FIG. 11C illustrates a transmission electron diffraction measurement apparatus that includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 is not necessarily provided.

Figure 11D:
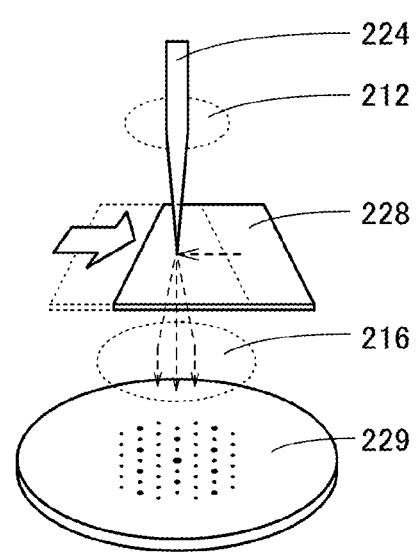

FIG. 11D illustrates the internal structure of the transmission electron diffraction measurement apparatus in FIG. 11C. In the transmission electron diffraction measurement apparatus, a substance 228 that is positioned in the sample chamber 214 is irradiated with electrons 224 emitted from an electron gun installed in the electron gun chamber 210 through the optical system 212. Electrons passing through the substance 228 are incident on a fluorescent plate 229 provided in the observation chamber 220 through the optical system 216. On the fluorescent plate 229, a pattern corresponding to the intensity of the incident electrons appears, which allows measurement of a transmission electron diffraction pattern.

The camera 218 is installed so as to face the fluorescent plate 229 and can take an image of a pattern appearing on the fluorescent plate 229. An angle formed by a straight line that passes through the center of a lens of the camera 218 and the center of the fluorescent plate 229 and an upper surface of the fluorescent plate 229 ranges, for example, from 15° to 80°, from 30° to 75°, or from 45° to 70°. As the angle is decreased, distortion of the transmission electron diffraction pattern taken by the camera 218 is increased. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of the electrons 224. In this case, a transmission electron diffraction pattern with less distortion can be taken from the rear surface of the fluorescent plate 229.

A holder for fixing the substance 228 that is a sample is provided in the sample chamber 214. The holder transmits electrons passing through the substance 228. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 228.

Then, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 11D. At this time, when the substance 228 is a CAAC-OS film, a diffraction pattern such as one shown in FIG. 11A is observed. When the substance 228 is an nc-OS film, a diffraction pattern such as one shown in FIG. 11B is observed.

Even when the substance 228 is a CAAC-OS film, a diffraction pattern similar to that of an nc-OS film or the like may be observed. Therefore, the quality of a CAAC-OS film can be represented by the proportion of a region where a diffraction pattern of a CAAC-OS film is observed (also referred to as proportion of CAAC (c-axis aligned crystal)). In a high-quality CAAC-OS film, for example, the proportion of CAAC is 50% or higher, preferably 80% or higher, further preferably 90% or higher, still further preferably 95% or higher. Note that a region where a diffraction pattern different from that of a CAAC-OS film is observed is referred to as the proportion of non-CAAC.

Figure 13A:
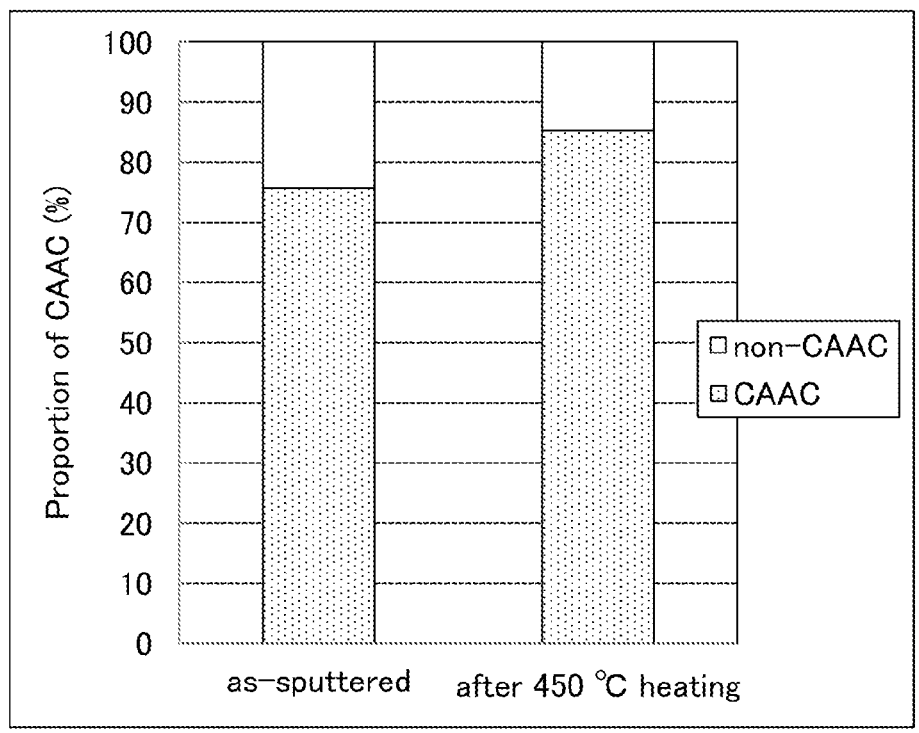
FIG. 13A shows an example of structural analysis by transmission electron diffraction measurement.

For example, the proportion of CAAC of a CAAC-OS film obtained just after deposition (represented as "as-sputtered") and a CAAC-OS film subjected to heat treatment at 450° C. in an atmosphere containing oxygen is summarized in FIG. 13A.

The proportion of CAAC of the as-sputtered CAAC-OS film is 75.7% (the proportion of non-CAAC was 24.3%). The proportion of CAAC of the CAAC-OS film subjected to the heat treatment at 450° C. is 85.3% (the proportion of non-CAAC was 14.7%). These results show that the proportion of CAAC obtained after the heat treatment at 450° C. is higher than that obtained just after the deposition. That is, heat treatment at a high temperature (e.g., 400° C. or higher) reduces the proportion of non-CAAC (increases the proportion of CAAC). The above results also indicate that the CAAC-OS film can have a high proportion of CAAC even when the temperature of the heat treatment is lower than 500° C.

Here, most of diffraction patterns different from that of a CAAC-OS film are similar to that of an nc-OS film. Furthermore, an amorphous oxide semiconductor film is not found in the measurement region. Therefore, the above results suggest that the region of the nc-OS is rearranged by heat treatment owing to the influence of the adjacent region of the CAAC, whereby the region of the nc-OS becomes CAAC.

Figure 13B:
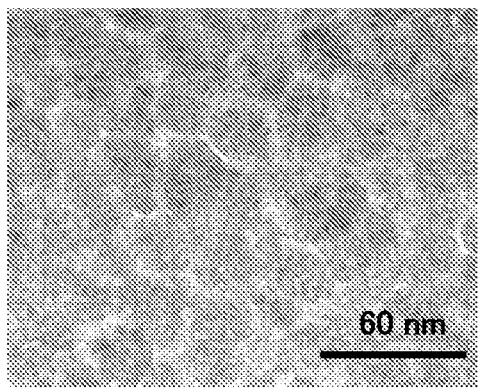
FIGS. 13B and 13C are high-resolution plan-view TEM images.
Figure 13C:
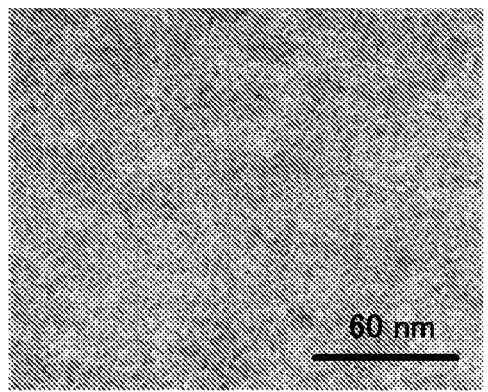

FIGS. 13B and 13C are high-resolution plan-view TEM images of the as-sputtered CAAC-OS film and the CAAC-OS film subjected to the heat treatment at 450° C., respectively. Comparison between FIGS. 13B and 13C shows that the CAAC-OS film subjected to the heat treatment at 450° C. has more uniform film quality. That is, heat treatment at a high temperature improves the film quality of the CAAC-OS film.

With such a measurement method, the structure of an oxide semiconductor film having a plurality of structures can be analyzed.

Note that the structures, methods, and the like described in this embodiment can be used as appropriate in combination with any of the structures, methods, and the like described in the other embodiments.

Embodiment 4

In this embodiment, examples of a layout diagram of the memory cell MC, and a circuit diagram and a schematic cross-sectional view corresponding to the layout diagram will be described with reference to FIGS. 14A and 14B and FIG. 15.

Figure 14A:
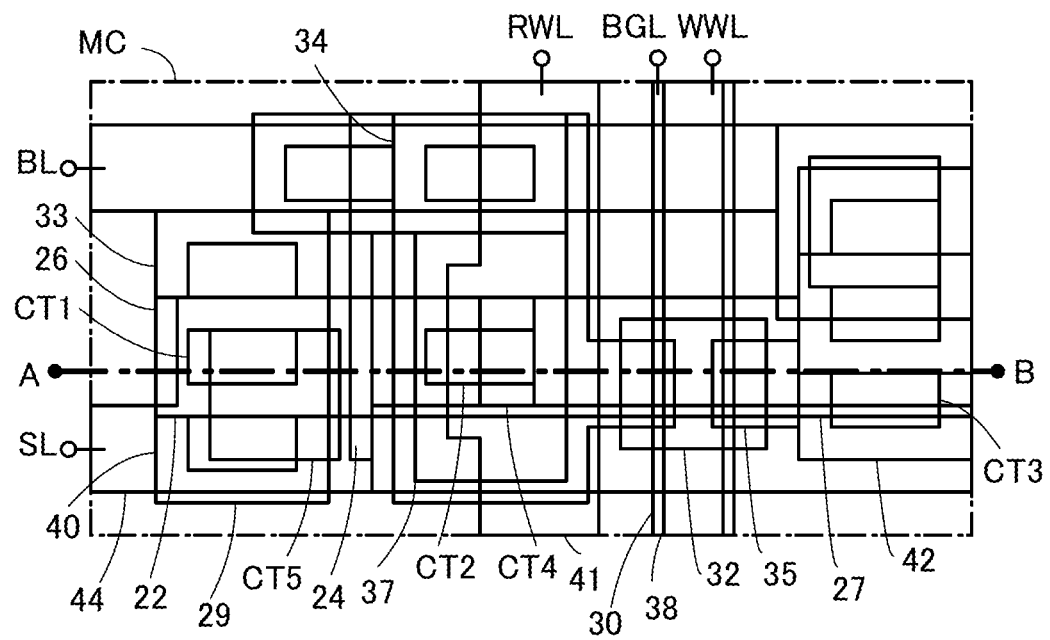
FIGS. 14A and 14B are a layout diagram and a circuit diagram for illustrating one embodiment of the present invention.

FIG. 14A is a layout diagram of the memory cell MC. FIG. 14B is a circuit diagram corresponding to the layout diagram of FIG. 14A. The circuit diagram of FIG. 14B corresponds to that of FIG. 9B. FIG. 15 is a schematic cross-sectional view along dashed-dotted line A-B in FIG. 14A.

Figure 15:
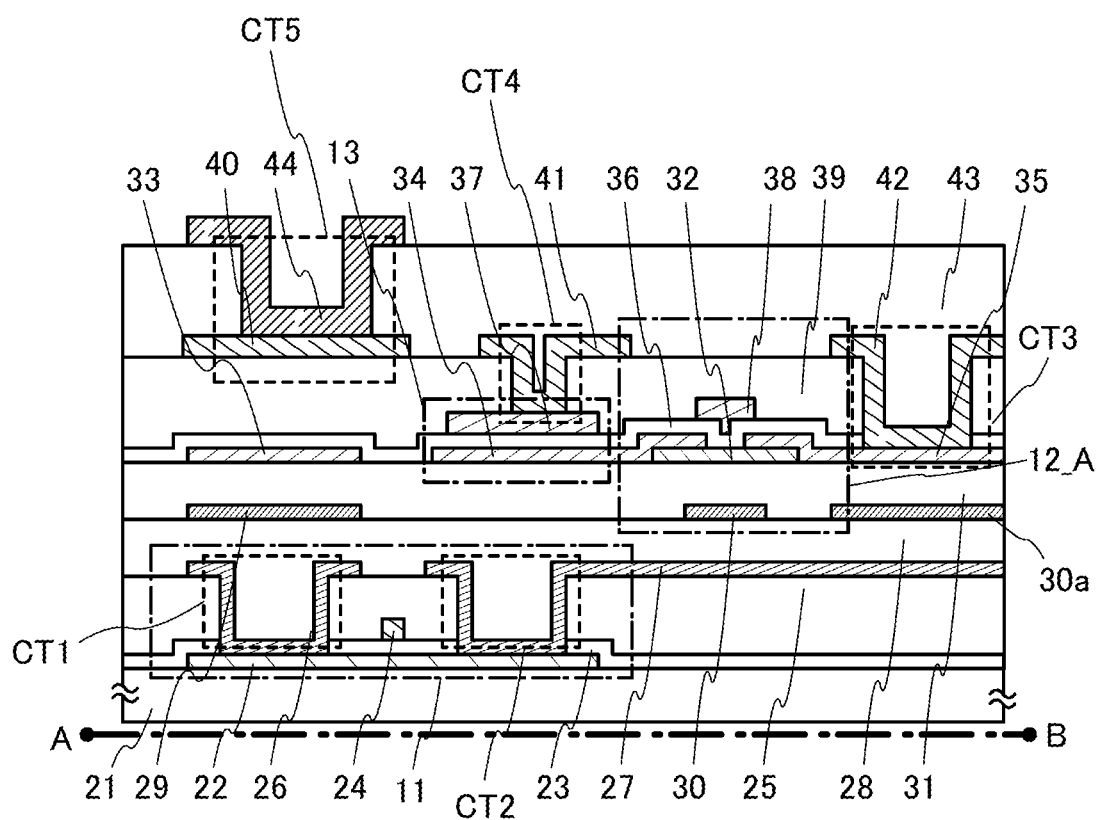
FIG. 15 is a schematic cross-sectional view illustrating one embodiment of the present invention.

FIG. 14A and FIG. 15 illustrate a substrate 21, a semiconductor layer 22, an insulating layer 23, a conductive layer 24, an insulating layer 25, a conductive layer 26, a conductive layer 27, an insulating layer 28, a conductive layer 29, a conductive layer 30, a conductive layer 30a, an insulating layer 31, a semiconductor layer 32, a conductive layer 33, a conductive layer 34, a conductive layer 35, an insulating layer 36, a conductive layer 37, a conductive layer 38, an insulating layer 39, a conductive layer 40, a conductive layer 41, a conductive layer 42, an insulating layer 43, a conductive layer 44, and openings CT1 to CT5.

The substrate 21 can be, for example, a single crystal silicon substrate (including a p-type semiconductor substrate or an n-type semiconductor substrate), a compound semiconductor substrate containing silicon carbide or gallium nitride, a silicon on insulator (SOI) substrate, or a glass substrate.

An amorphous semiconductor, a microcrystalline semiconductor, a polycrystalline semiconductor, or the like can be used for the semiconductor layers 22 and 32. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, the semiconductor layer 32 is preferably a single layer or a stacked layer formed using an oxide semiconductor. The oxide semiconductor described in Embodiment 4 can be used. The oxide semiconductor can be formed by a sputtering method, an atomic layer deposition (ALD) method, an evaporation method, a coating method, or the like.

A metal material such as aluminum, copper, titanium, tantalum, or tungsten is preferably used for each of the conductive layers 24, 26, 27, 29, 30, 30a, 33, 34, 35, 37, 38, 40, 41, 42, and 44. Alternatively, polycrystalline silicon to which an impurity such as phosphorus is added can be used. As the formation method, a variety of film formation methods such as an evaporation method, a plasma-enhanced chemical vapor deposition (PE-CVD) method, a sputtering method, and a spin coating method can be used.

Each of the insulating layers 23, 25, 28, 31, 36, 39, and 43 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using a polyimide, an acrylic resin, or the like. There is no particular limitation on a method for forming each of the insulating layers; for example, a sputtering method, a molecular beam epitaxy (MBE) method, a PE-CVD method, a pulse laser deposition method, or an ALD method can be employed as appropriate.

When an oxide semiconductor is used for the semiconductor layer 32, each of the insulating layers 31 and 36 in contact with the semiconductor layer 32 is preferably a single or multilayer inorganic insulating layer. More preferably, the insulating layers 31 and 36 have an effect of supplying oxygen to the semiconductor layer 32.

The openings CT1 and CT2 are provided in the insulating layers 23 and 25 in order to connect the conductive layers 26 and 27 to the semiconductor layer 22. The opening CT3 is provided in the insulating layers 36 and 39 in order to connect the conductive layer 35 and the conductive layer 42. The opening CT4 is provided in the insulating layer 39 in order to connect the conductive layer 37 and the conductive layer 41. The opening CT5 is provided in the insulating layer 43 in order to connect the conductive layer 40 and the conductive layer 44.

FIGS. 16A to 28B illustrate the layout diagram of the memory cell MC in FIG. 14A and the schematic cross-sectional view along dashed-dotted line A-B in FIG. 14A. These diagrams and the cross-sectional views show the order of stacking the conductive layers, the insulating layers, and the semiconductor layers and forming the openings.

Figure 16A:
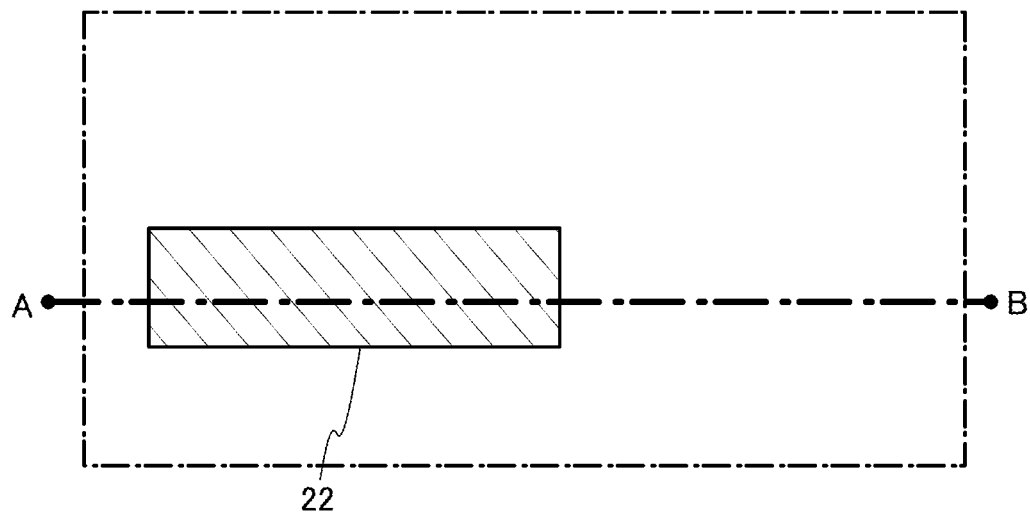
FIGS. 16A and 16B are a layout diagram and a schematic cross-sectional view for illustrating one embodiment of the present invention.
Figure 16B:
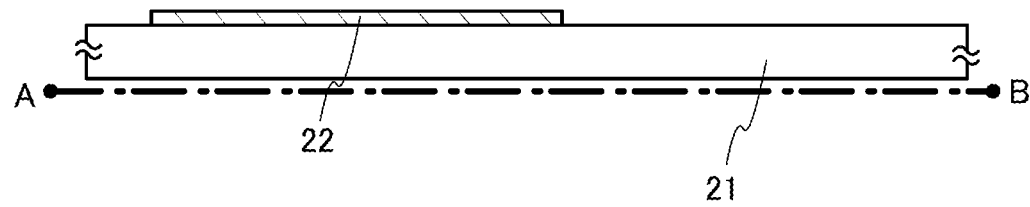

FIGS. 16A and 16B are a layout diagram and a schematic cross-sectional view of the semiconductor layer 22.

Figure 17A:
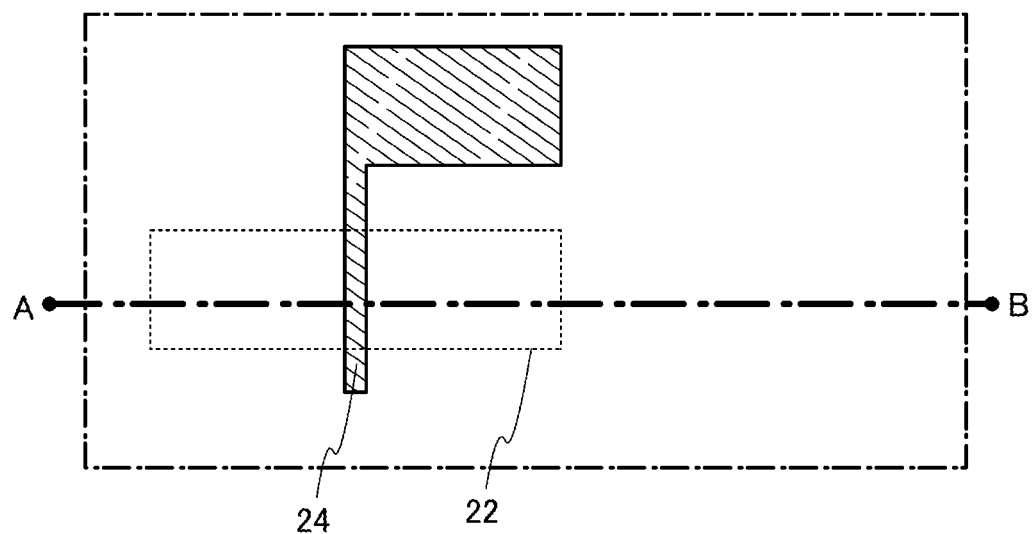
FIGS. 17A and 17B are a layout diagram and a schematic cross-sectional view for illustrating one embodiment of the present invention.
Figure 17B:
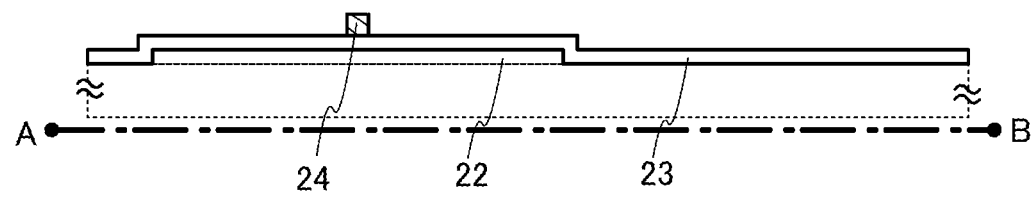

FIGS. 17A and 17B are a layout diagram and a schematic cross-sectional view of the conductive layer 24.

Figure 18A:
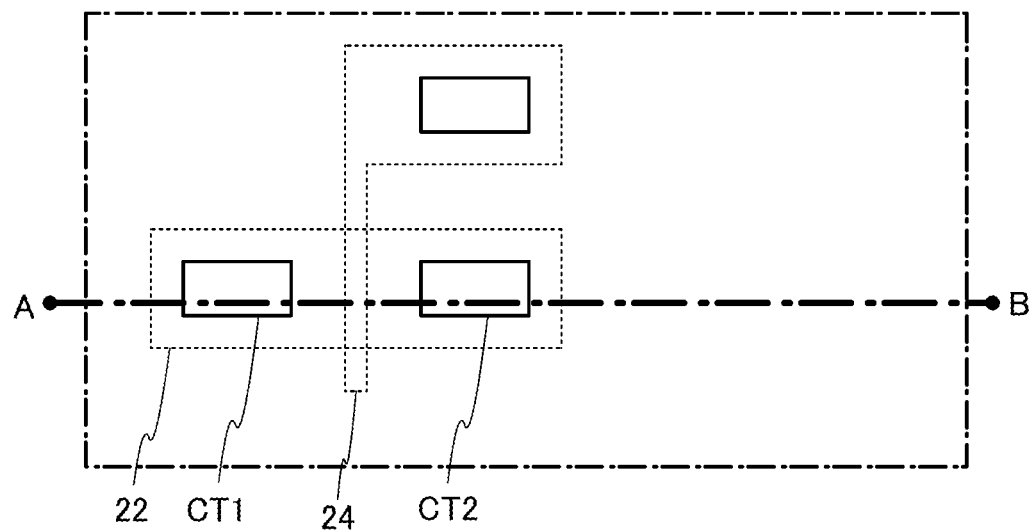
FIGS. 18A and 18B are a layout diagram and a schematic cross-sectional view for illustrating one embodiment of the present invention.
Figure 18B:
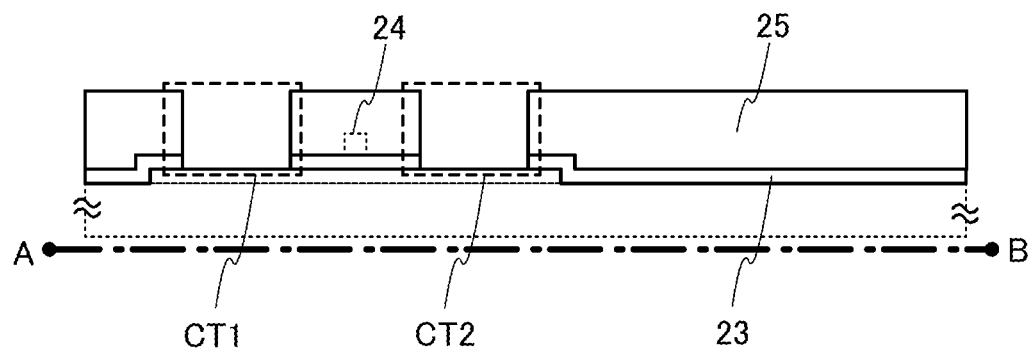

FIGS. 18A and 18B are a layout diagram and a schematic cross-sectional view of the openings CT1 and CT2 and an opening formed at the same level.

Figure 19A:
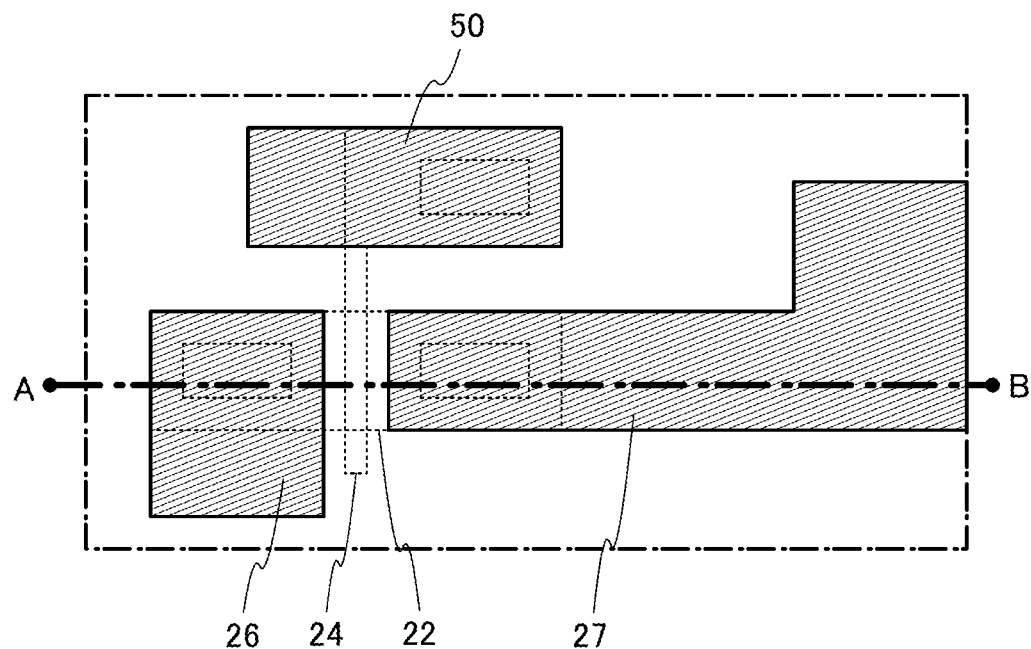
FIGS. 19A and 19B are a layout diagram and a schematic cross-sectional view for illustrating one embodiment of the present invention.
Figure 19B:
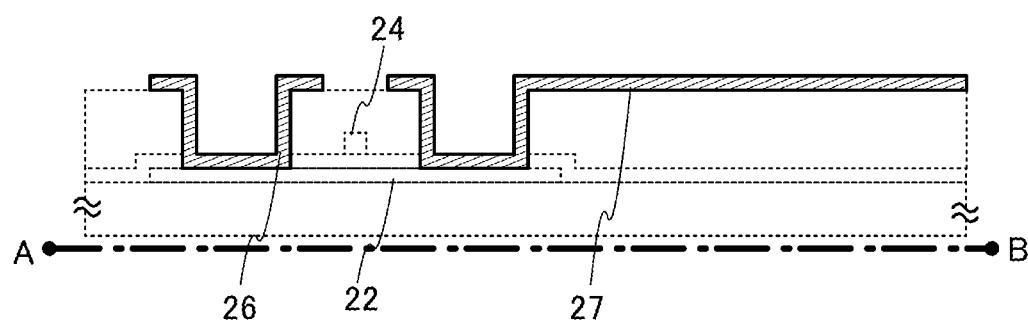

FIGS. 19A and 19B are a layout diagram and a schematic cross-sectional view of the conductive layers 26 and 27 and a conductive layer 50 formed at the same level.

Figure 20A:
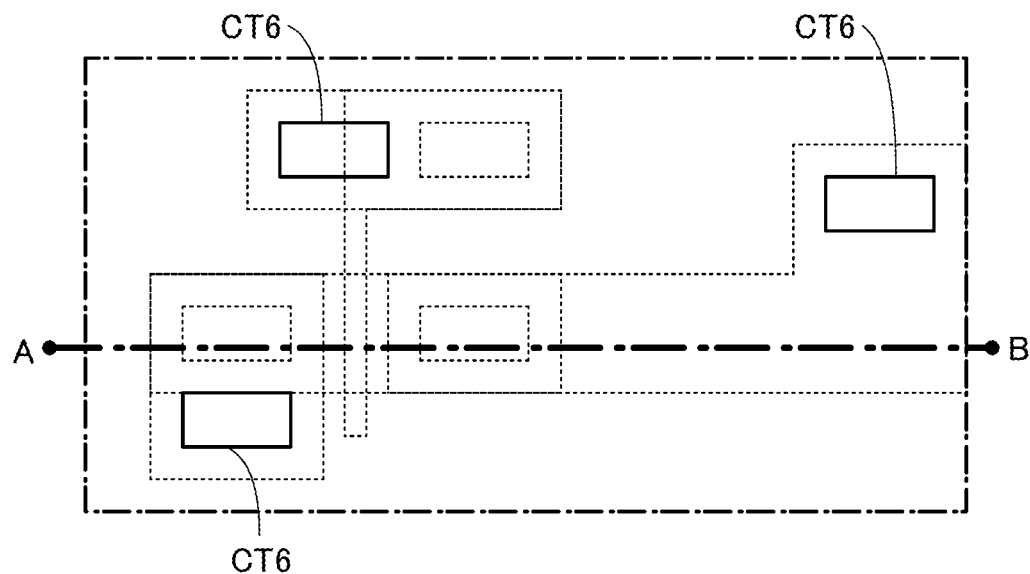
FIGS. 20A and 20B are a layout diagram and a schematic cross-sectional view for illustrating one embodiment of the present invention.
Figure 20B:
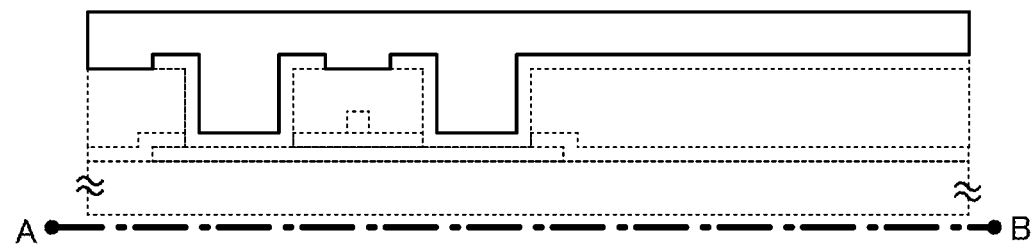

FIGS. 20A and 20B are a layout diagram and a schematic cross-sectional view of openings CT6 for electrically connecting the conductive layers 26, 27, and 50 to the conductive layers 29, 30a, and 52, respectively.

Figure 21A:
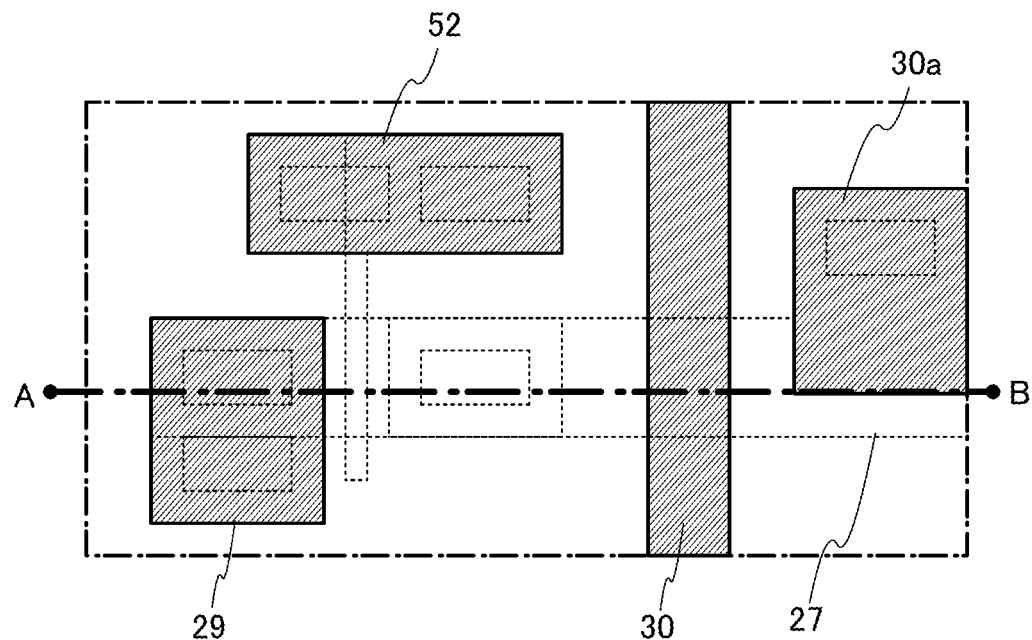
FIGS. 21A and 21B are a layout diagram and a schematic cross-sectional view for illustrating one embodiment of the present invention.
Figure 21B:
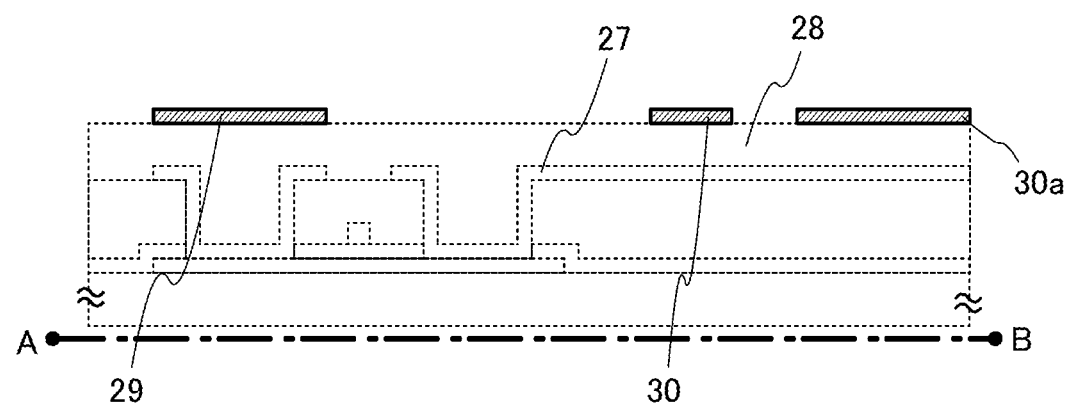

FIGS. 21A and 21B are a layout diagram and a schematic cross-sectional view of the conductive layers 29, 30, and 30a, and the conductive layer 52 formed at the same level.

Figure 22A:
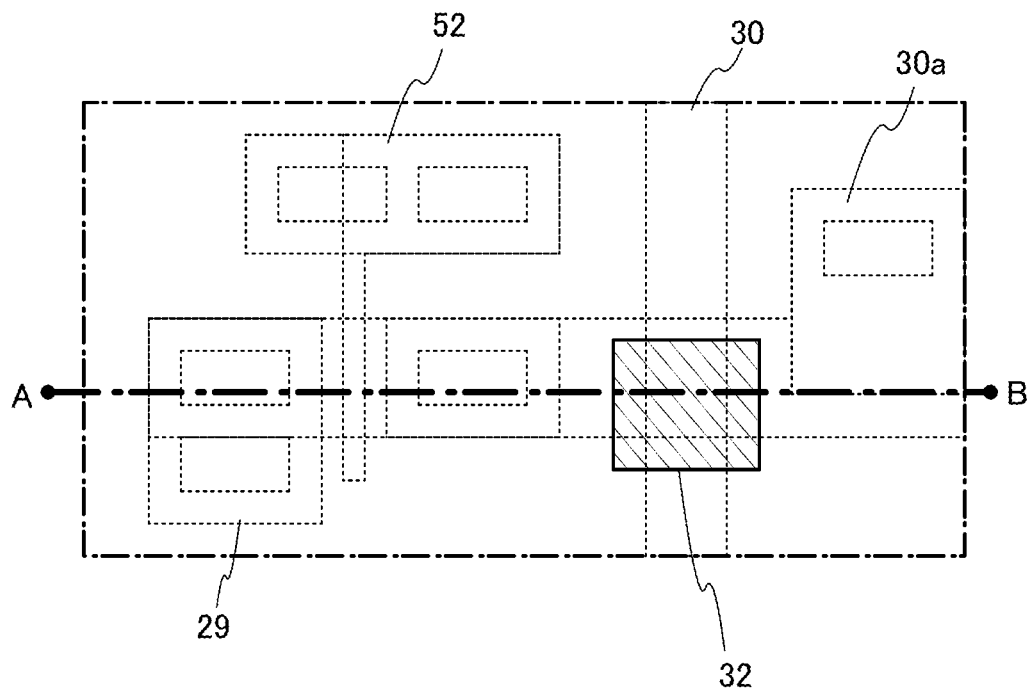
FIGS. 22A and 22B are a layout diagram and a schematic cross-sectional view for illustrating one embodiment of the present invention.
Figure 22B:
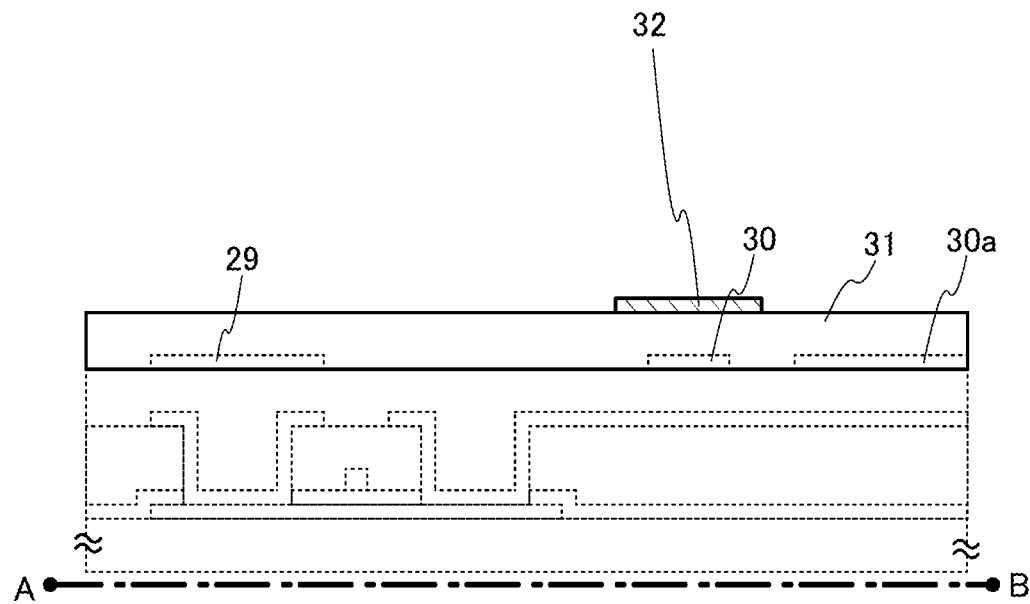

FIGS. 22A and 22B are a layout diagram and a schematic cross-sectional view of the semiconductor layer 32.

Figure 23A:
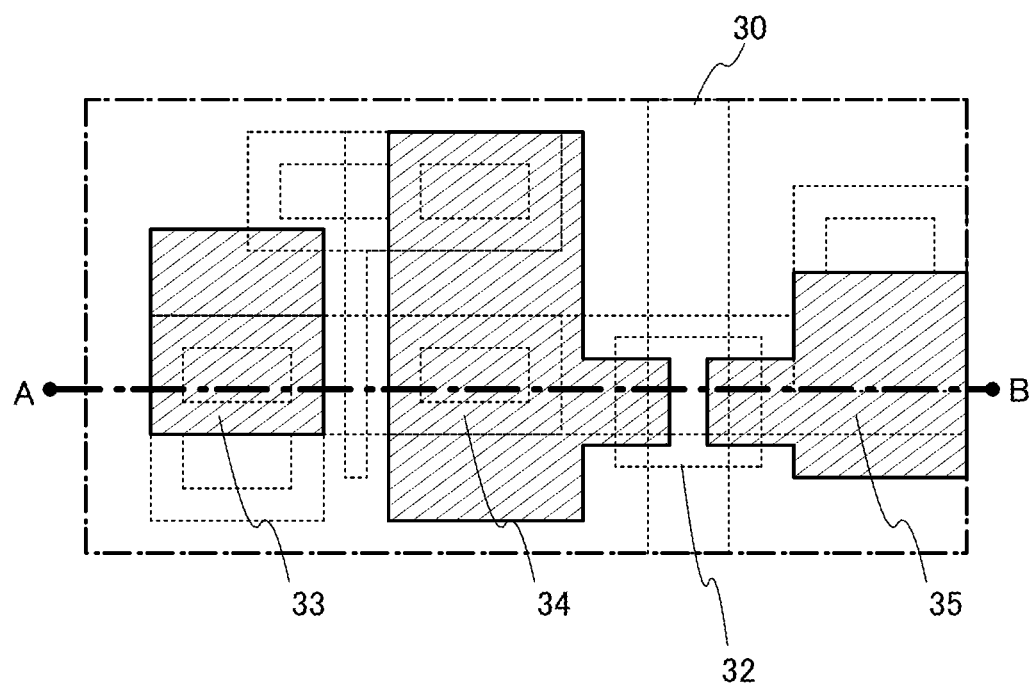
FIGS. 23A and 23B are a layout diagram and a schematic cross-sectional view for illustrating one embodiment of the present invention.
Figure 23B:
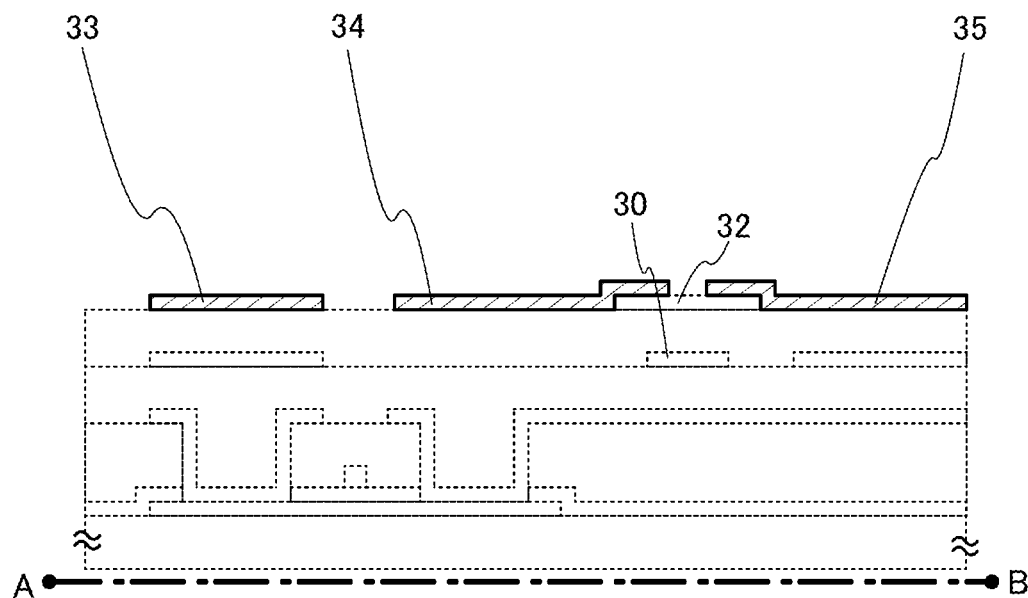

FIGS. 23A and 23B are a layout diagram and a schematic cross-sectional view of the conductive layers 33, 34, and 35.

Figure 24A:
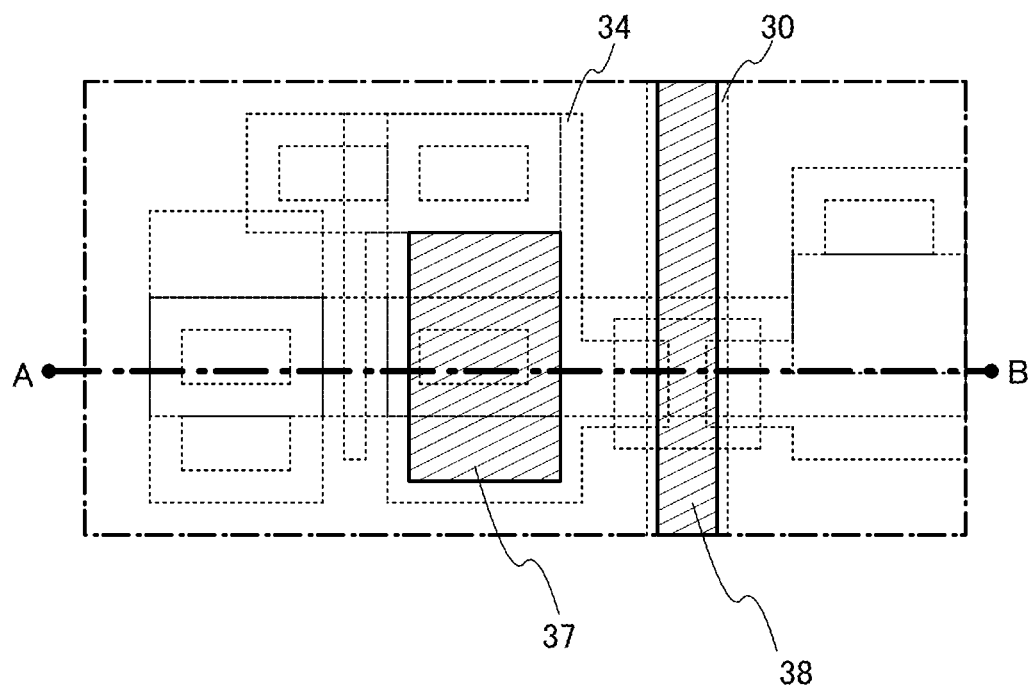
FIGS. 24A and 24B are a layout diagram and a schematic cross-sectional view for illustrating one embodiment of the present invention.
Figure 24B:
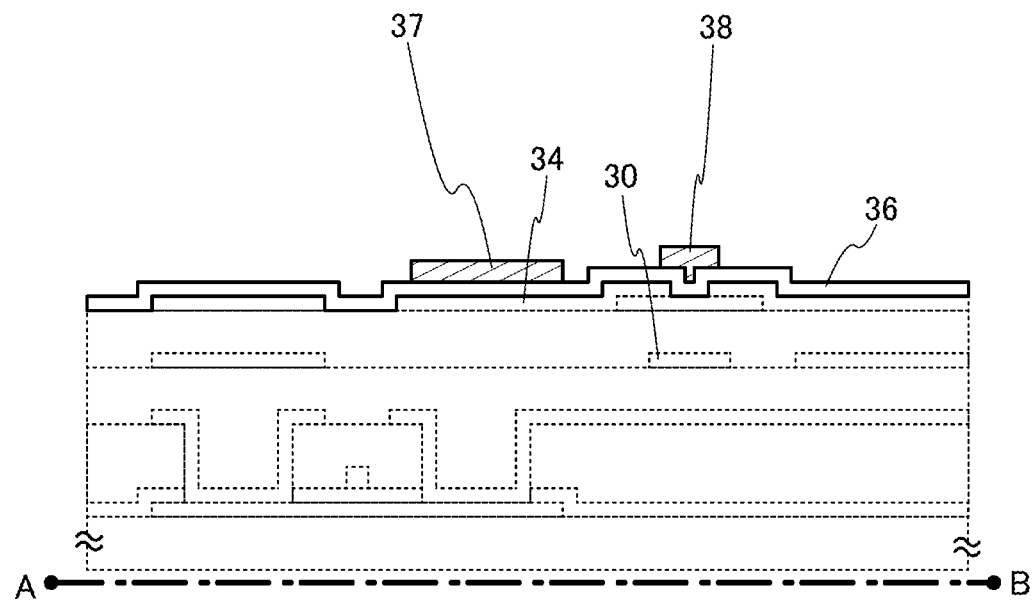

FIGS. 24A and 24B are a layout diagram and a schematic cross-sectional view of the conductive layers 37 and 38.

Figure 25A:
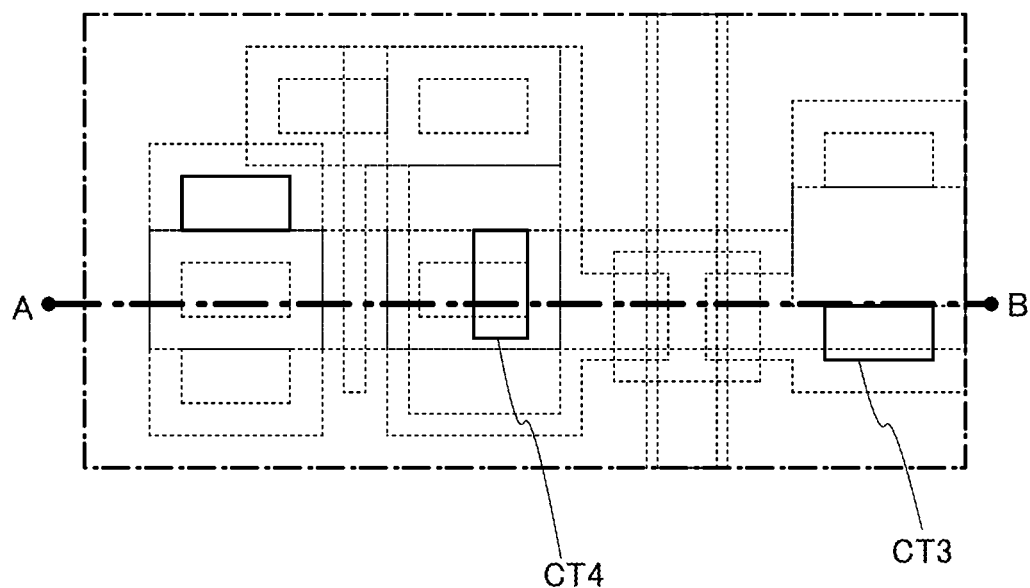
FIGS. 25A and 25B are a layout diagram and a schematic cross-sectional view for illustrating one embodiment of the present invention.
Figure 25B:
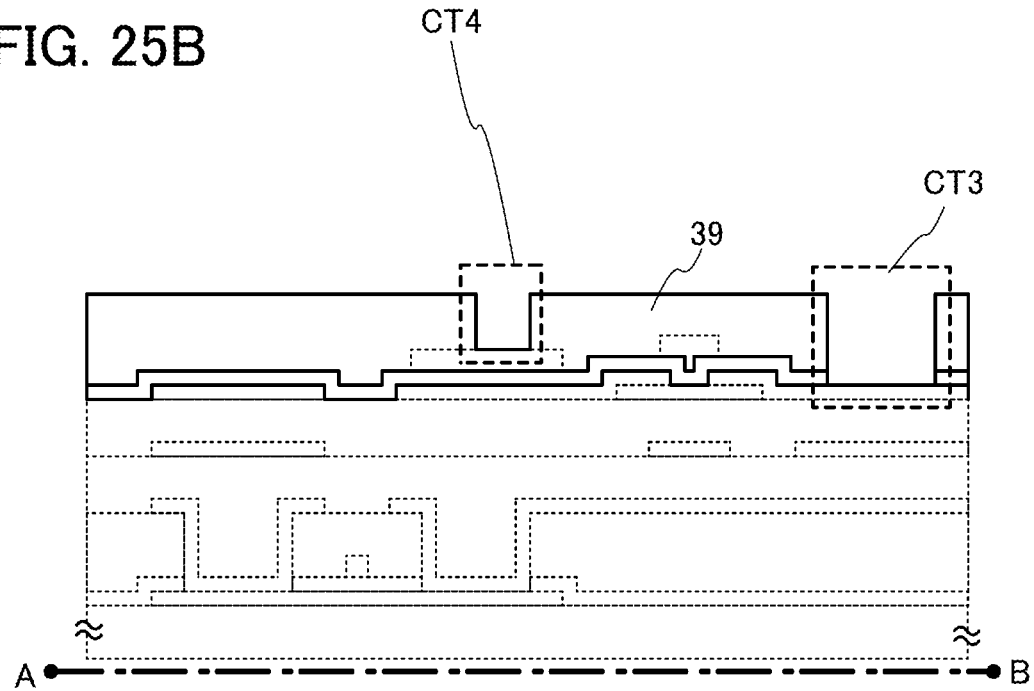

FIGS. 25A and 25B are a layout diagram and a schematic cross-sectional view of the openings CT3 and CT4 and an opening formed at the same level.

Figure 26A:
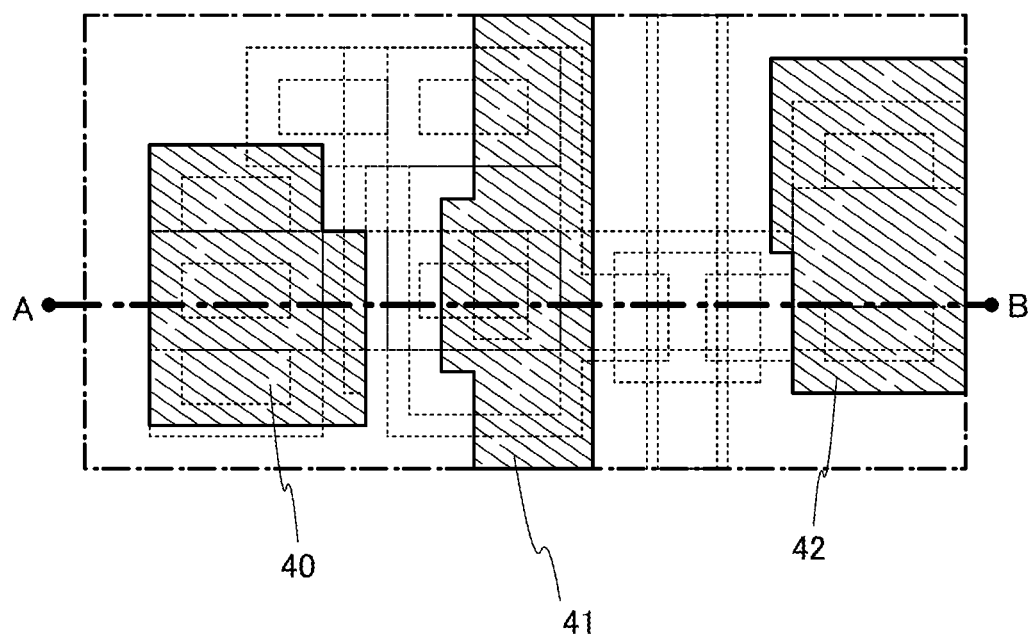
FIGS. 26A and 26B are a layout diagram and a schematic cross-sectional view for illustrating one embodiment of the present invention.
Figure 26B:
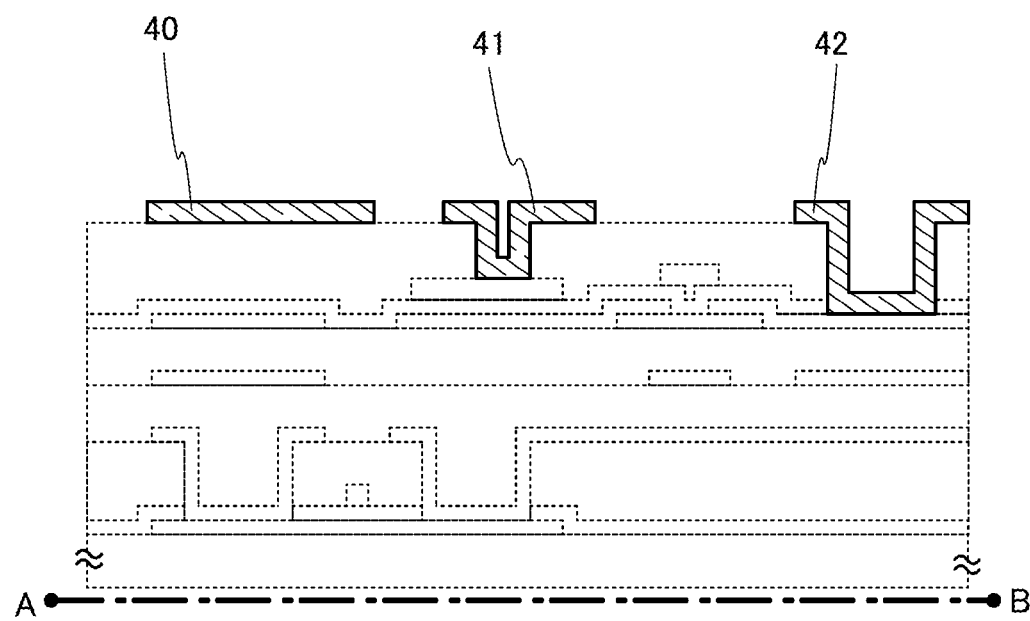

FIGS. 26A and 26B are a layout diagram and a schematic cross-sectional view of the conductive layers 40, 41, and 42.

Figure 27A:
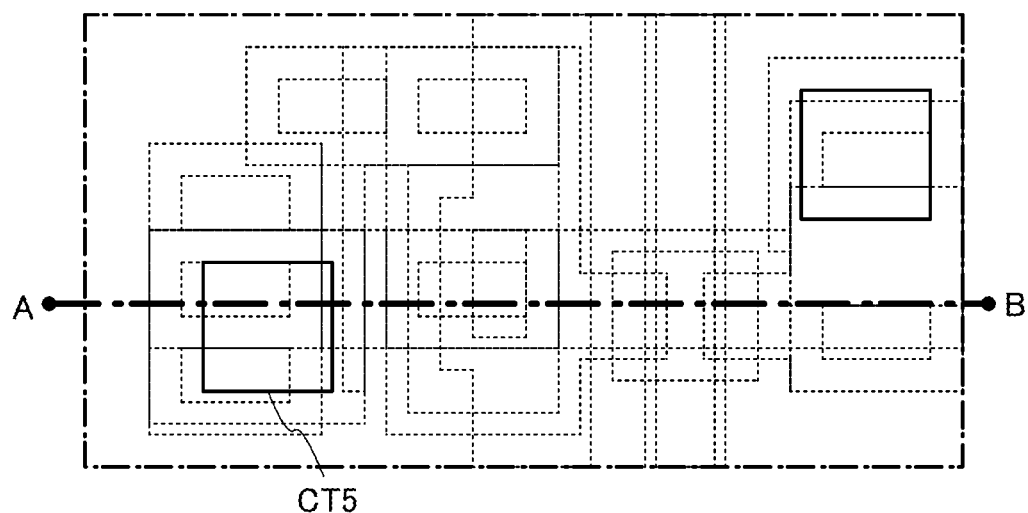
FIGS. 27A and 27B are a layout diagram and a schematic cross-sectional view for illustrating one embodiment of the present invention.
Figure 27B:
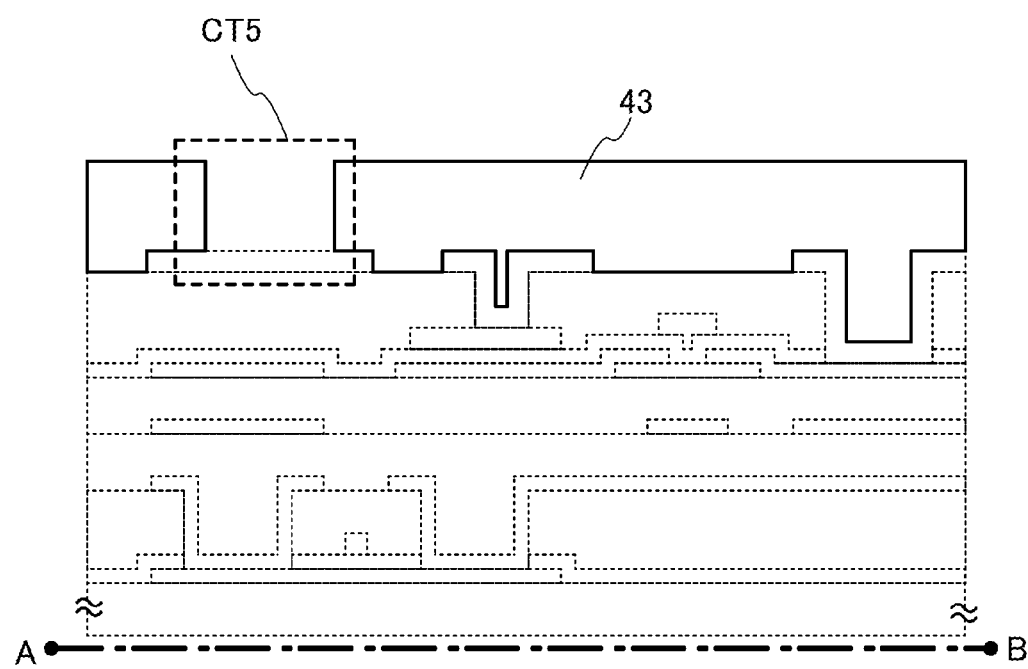

FIGS. 27A and 27B are a layout diagram and a schematic cross-sectional view of the opening CT5 and an opening formed at the same level.

Figure 28A:
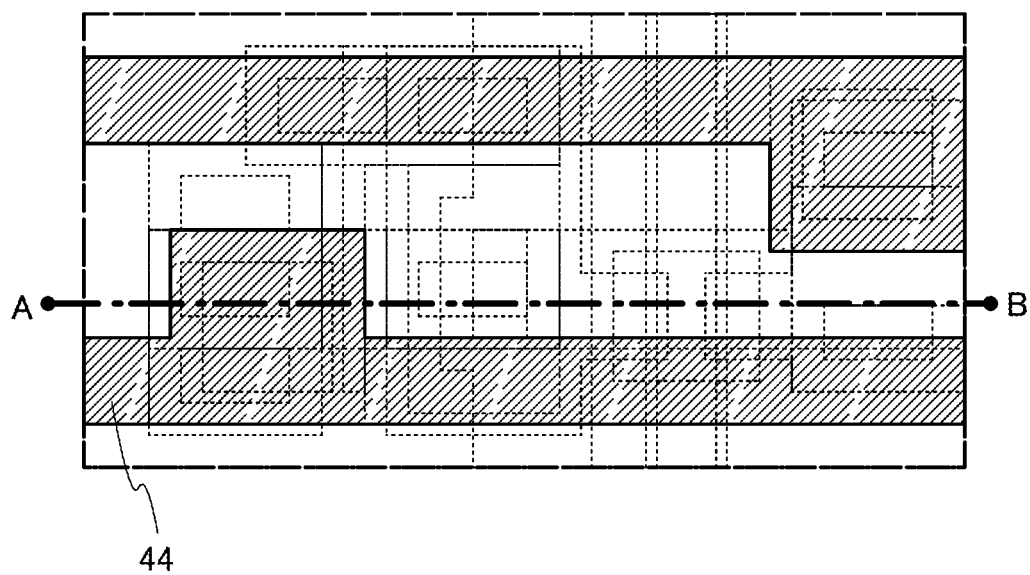
FIGS. 28A and 28B are a layout diagram and a schematic cross-sectional view for illustrating one embodiment of the present invention.
Figure 28B:
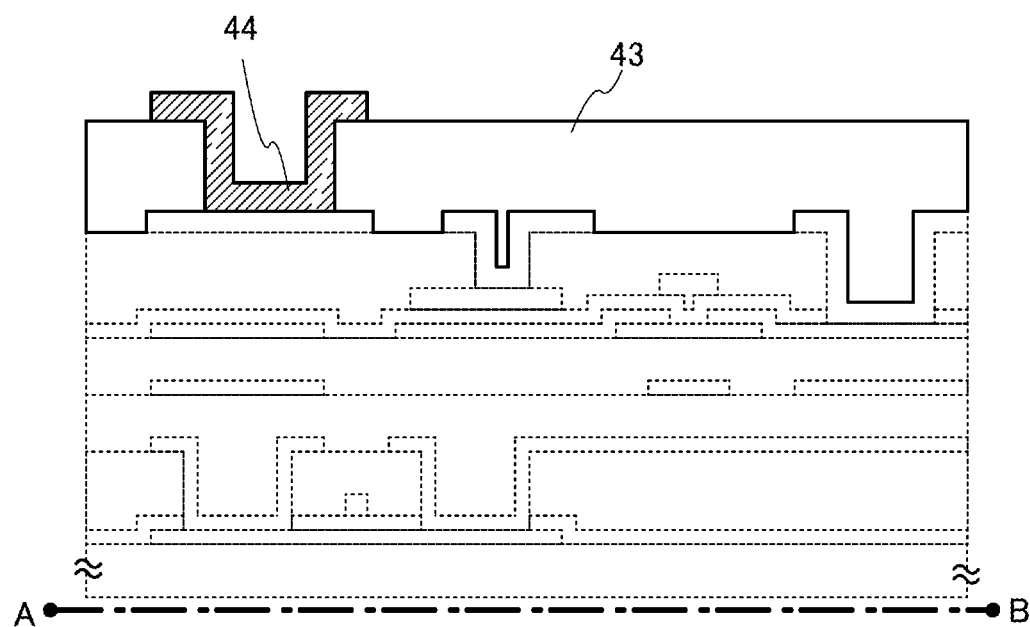

FIGS. 28A and 28B are a layout diagram and a schematic cross-sectional view of the conductive layer 44 and a conductive layer formed at the same level.

As shown in the layout diagram of FIGS. 14A and 23A, the conductive layers 34 and 35 in contact with the semiconductor layer 32 are preferably provided not to completely cover the sides of the semiconductor layer 32, which are parallel to the channel width direction. This structure reduces the area where the conductive layers 34 and 35 overlap with the conductive layers 30 and 38, thereby reducing parasitic capacitance between the conductive layers. Thus, it is possible to suppress a change in potential of the conductive layers 34 and 35 due to a change in potential of the conductive layers 30 and 38.

Note that the structures, methods, and the like described in this embodiment can be used as appropriate in combination with any of the structures, methods, and the like described in the other embodiments.

Embodiment 5

Although the conductive layer and the semiconductor layer described in the above embodiments can be formed by sputtering, they may be formed by another method, for example, a thermal CVD method. Examples of a thermal CVD method include a metal organic chemical vapor deposition (MOCVD) method and an ALD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidize are reacted with each other in the vicinity of a substrate or over the substrate.

In an ALD method, deposition is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. Two or more kinds of source gases may be sequentially supplied to the chamber. In this case, after the reaction of a first source gas, an inert gas is introduced, and then a second source gas is introduced so that the source gases are not mixed. Alternatively, the second source gas may be introduced after the first source gas is exhausted by vacuum evacuation instead of the introduction of the inert gas. The first source gas is adsorbed on the surface of a substrate and reacted to form a first layer, and then, the second source gas introduced thereafter is absorbed and reacted; as a result, a second layer is stacked over the first layer, so that a thin film is formed. The sequence of the gas introduction is repeated multiple times until a desired thickness is obtained, whereby a thin film with excellent step coverage can be formed. The thickness of the thin film can be adjusted by the number of repetitions of the gas introduction; therefore, an ALD method makes it possible to accurately adjust a thickness and thus is suitable for manufacturing a minute FET.

The conductive film and the semiconductor film described in the above embodiments can be formed by thermal CVD such as MOCVD or ALD. For example, trimethylindium ($In(CH_3)_3$), trimethylgallium ($Ga(CH_3)_3$), and dimethylzinc ($Zn(CH_3)_2$) are used to form an In—Ga—Zn—O film. Without limitation to the above combination, triethylgallium (Ga($C_2H_5$)$_3$) can be used instead of trimethylgallium, and diethylzinc ($Zn(C_2H_5)_2$) can be used instead of dimethylzinc.

For example, when a tungsten film is formed with a deposition apparatus using ALD, a $WF_6$ gas and a $B_2H_6$ gas are sequentially introduced to form an initial tungsten film, then a $WF_6$ gas and an $H_2$ gas are sequentially introduced, and the latter process is repeated so that a tungsten film is formed. Note that a $SiH_4$ gas may be used instead of a $B_2H_6$ gas.

When an oxide semiconductor film, for example, an In—Ga—Zn—O film is formed with a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed oxide layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H.

The structure described above in this embodiment can be combined as appropriate with any of the structures described in the other embodiments.

Embodiment 6

In this embodiment, application examples of the memory device described in the foregoing embodiments to an electronic component and to an electronic device including the electronic component will be described with reference to FIGS. 29A and 29B and FIGS. 30A to 30E.

Figure 29A:
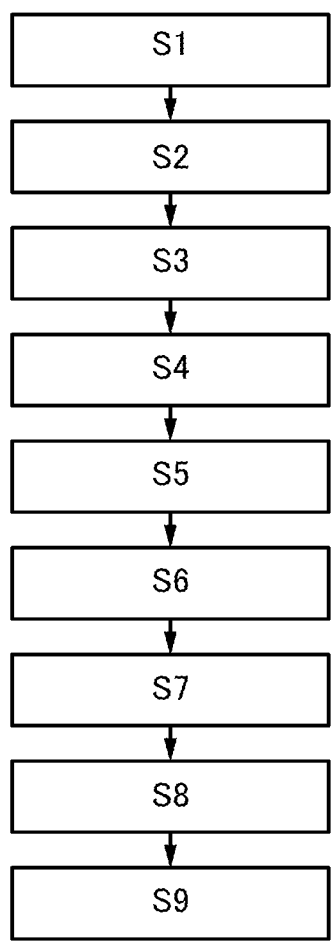
FIG. 29A is a flowchart showing a fabrication process of an electronic component.

FIG. 29A shows an example where the memory device described in the foregoing embodiment is used to prepare an electronic component. Note that an electronic component is also referred to as semiconductor package or IC package. For the electronic component, there are various standards and names corresponding to the direction of terminals or the shape of terminals; hence, one example of the electronic component will be described in this embodiment.

Figure 14B:
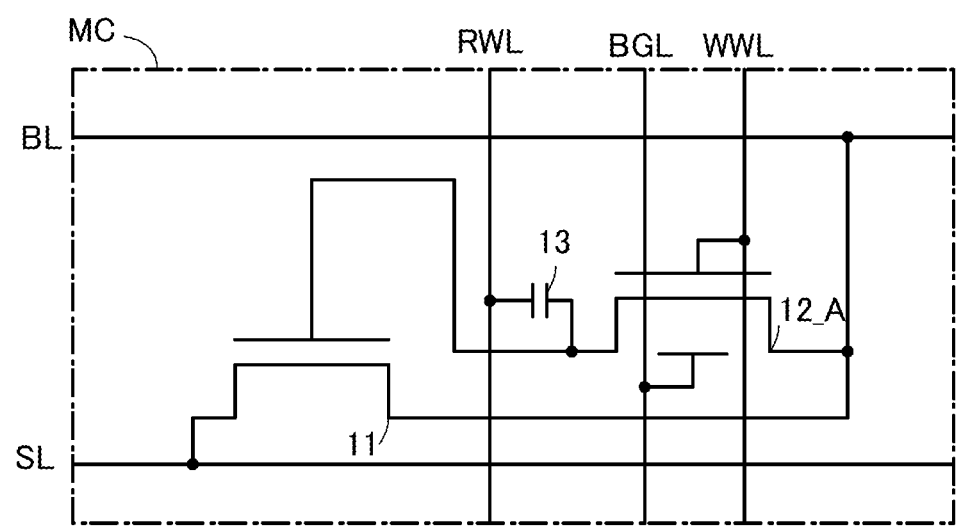

A memory device including the transistors illustrated in FIGS. 14A and 14B and FIG. 15 of Embodiment 4 is completed by integrating detachable components on a printed circuit board through the assembly process (post-process).

The post-process can be completed through steps shown in FIG. 29A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the memory device described in the foregoing embodiment, it is possible to obtain an electronic component with excellent data retention characteristics.

Figure 29B:
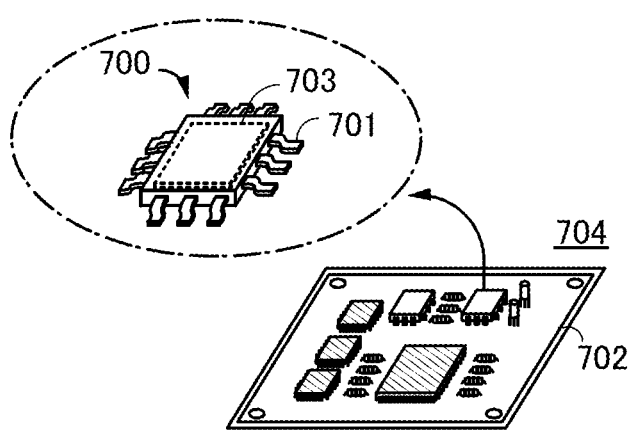
FIG. 29B is a schematic perspective view of the electronic component.

FIG. 29B is a schematic perspective diagram of a completed electronic component. FIG. 29B shows a schematic perspective diagram of a quad flat package (QFP) as an example of the electronic component. An electronic component 700 illustrated in FIG. 29B includes a lead 701 and a circuit portion 703. The electronic component 700 in FIG. 29B is, for example, mounted on a printed circuit board 702. A combination of electronic components 700 electrically connected to each other over the printed circuit board 702 can be equipped in an electronic device. A completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 30A:
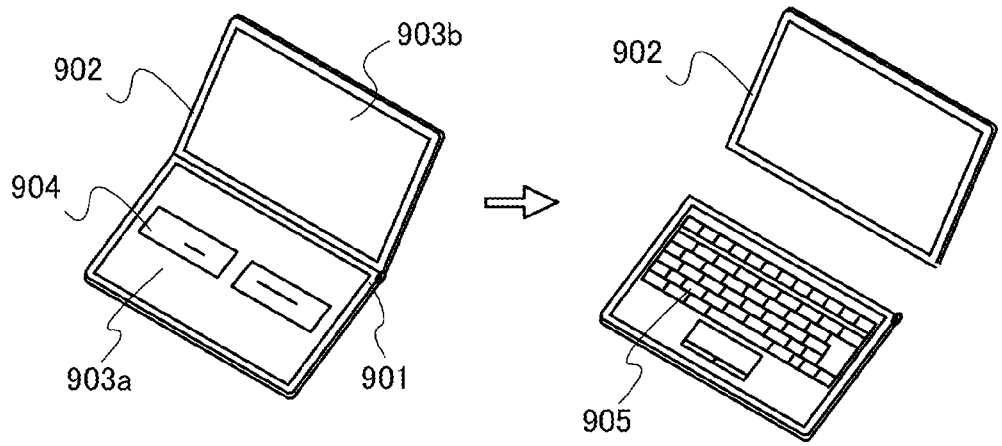
FIGS. 30A to 30E each illustrate an electronic device including an electronic component.

FIG. 30A illustrates a portable information appliance that includes a housing 901, a housing 902, a first display portion 903a, a second display portion 903b, and the like. At least one of the housings 901 and 902 is provided with the electronic component including the memory device of the foregoing embodiment. It is thus possible to obtain a portable information appliance with excellent data retention characteristics.

Note that the first display portion 903a is a panel having a touch input function, and for example, as illustrated in the left of FIG. 30A, operation via "touch input" or "keyboard input" can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 30A. Thus, letters can be input quickly by key input as in a conventional information appliance, for example.

One of the first display portion 903a and the second display portion 903b can be detached from the portable information appliance as shown in the right of FIG. 30A. Providing the second display portion 903b with a touch input function makes the information appliance convenient to carry because a weight can be further reduced and the information appliance can operate with one hand while the other hand supports the housing 902.

The portable information appliance in FIG. 30A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 30A may be configured to transmit and receive data wirelessly. Through wireless communication, desired book data or the like can be purchased and downloaded from an e-book server.

In addition, the housing 902 illustrated in FIG. 30A may be equipped with an antenna, a microphone function, and a wireless communication function to be used as a mobile phone.

Figure 30B:
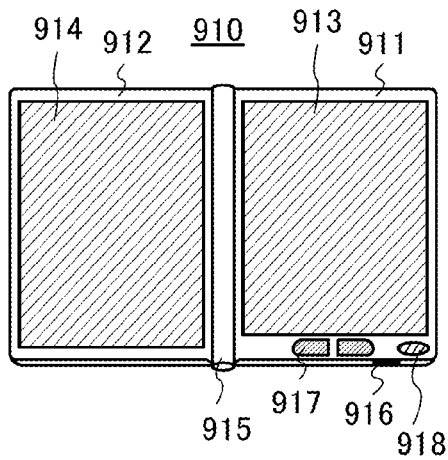

FIG. 30B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the memory device of the foregoing embodiment is provided in at least one of the housings 911 and 912. It is thus possible to obtain an e-book reader with excellent data retention characteristics.

Figure 30C:
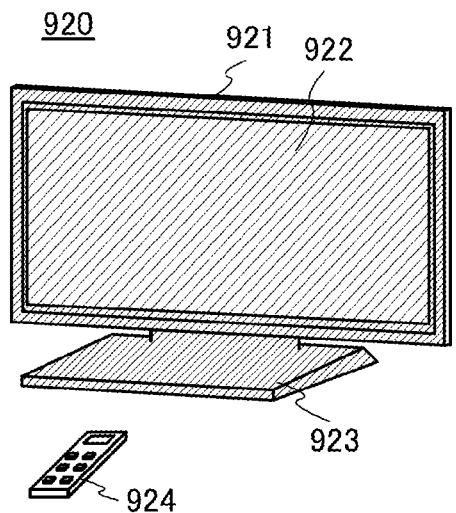

FIG. 30C illustrates a television device 920 including a housing 921, a display portion 922, a stand 923, and the like. The television device 920 can be controlled by a switch of the housing 921 and a separate remote controller 924. The electronic component including the memory device of the foregoing embodiment is provided in the housing 921 and the remote controller 924. Thus, it is possible to obtain a television device with excellent data retention characteristics.

Figure 30D:
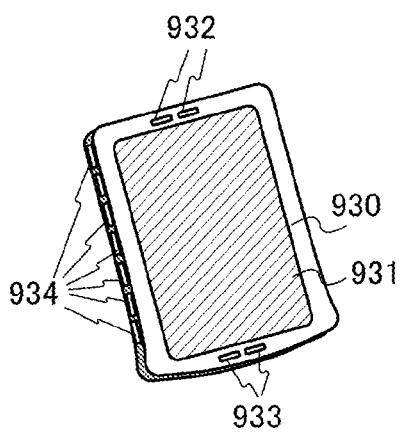

FIG. 30D illustrates a smartphone in which a main body 930 is provided with a display portion 931, a speaker 932, a microphone 933, operation buttons 934, and the like. The electronic component including the memory device of the foregoing embodiment is provided in the main body 930. It is thus possible to obtain a smartphone with excellent data retention characteristics.

Figure 30E:
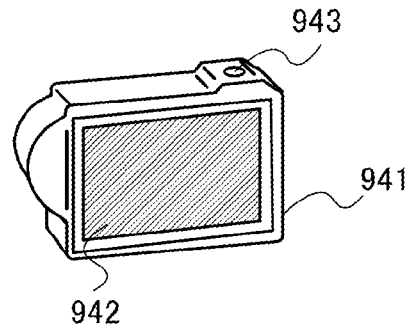

FIG. 30E illustrates a digital camera including a main body 941, a display portion 942, an operation switch 943, and the like. The electronic component including the memory device of the foregoing embodiment is provided in the main body 941. Consequently, it is possible to obtain a digital camera with excellent data retention characteristics.

As described above, the electronic device shown in this embodiment includes the electronic component including the memory device of the foregoing embodiment, thereby having excellent data retention characteristics.

This application is based on Japanese Patent Application serial no. 2014-110726 filed with Japan Patent Office on May 29, 2014, the entire contents of which are hereby incorporated by reference.

What is claimed is:

1. A memory device comprising:
  a memory cell comprising:
    a first transistor comprising a gate, a source, and a drain;
    a second transistor comprising a gate, a source, and a drain; and
    a capacitor comprising a first electrode and a second electrode; and
  a refresh circuit,
  wherein the memory cell is configured to retain data as a potential at a node which is connected to the gate of the first transistor, one of the source and the drain of the second transistor, and one of the first electrode and the second electrode of the capacitor,
  wherein the refresh circuit is configured to perform refresh operation by supplying the memory cell with a refresh potential, and
  wherein the refresh potential is a sum of the potential read from the node and a potential corresponding to a change of the potential of the node due to leakage of charge from the node.

2. The memory device according to claim 1, wherein the memory cell is configured to retain multiple data.

3. The memory device according to claim 1, wherein the refresh circuit is further configured to determine an interval of the refresh operation.

4. The memory device according to claim 1, wherein the refresh circuit is further configured to estimate the change of the potential of the node.

5. The memory device according to claim 1, wherein the second transistor comprises a channel formation region which includes an oxide semiconductor.

6. The memory device according to claim 1, wherein the first transistor comprises a channel formation region which includes silicon.

7. An electronic component comprising the memory device according to claim 1.

8. An electronic device comprising the electronic component according to claim 7.

9. A memory device comprising:
  a memory cell comprising:
    a first transistor comprising a gate, a source, and a drain;
    a second transistor comprising a gate, a source, and a drain; and
    a first capacitor comprising a first electrode and a second electrode; and
  a refresh circuit configured to perform a refresh operation, the refresh circuit comprising:
    a refresh timing control circuit;
    a compensation voltage generator circuit; and
    a voltage adder circuit,
  wherein the memory cell is configured to retain data as a potential at a first node which is connected to the gate of the first transistor, one of the source and the drain of the second transistor, and one of the first electrode and the second electrode of the capacitor,
  wherein the refresh timing control circuit is configured to determine an interval of the refresh operation,
  wherein the compensation voltage generator circuit is configured to estimate a potential corresponding to a change of the potential of the first node due to leakage of charge from the first node,
  wherein the voltage adder circuit is configured to supply the memory cell with a refresh potential, and
  wherein the refresh potential is a sum of the potential read from the first node and the potential corresponding to the change of the potential of the first node.

10. The memory device according to claim 9, wherein the refresh timing control circuit comprises:
  a third transistor comprising a gate, a source, and a drain; and a second capacitor comprising a first electrode and a second electrode, wherein one of the source and the drain of the third transistor is electrically connected to one of the first electrode and the second electrode of the second capacitor, and wherein the third transistor and the second transistor have the same characteristics.

11. The memory device according to claim 9, wherein the compensation voltage generator circuit comprises:
- a fourth transistor comprising a gate, a source, and a drain; and
- a third capacitor comprising a first electrode and a second electrode, wherein one of the source and the drain of the fourth transistor is electrically connected to one of the first electrode and the second electrode of the third capacitor, and wherein the fourth transistor and the second transistor have the same characteristics.

12. The memory device according to claim 9, wherein the memory cell is configured to retain multiple data.

13. The memory device according to claim 9, wherein the second transistor comprises a channel formation region which includes an oxide semiconductor.

14. The memory device according to claim 9, wherein the first transistor comprises a channel formation region which includes silicon.

15. An electronic component comprising the memory device according to claim 9.

16. An electronic device comprising the electronic component according to claim 15.

17. A method for operating a memory device, the method comprising:
- writing data to a memory cell by providing a potential to a first node;
- estimating a potential corresponding to a change of the potential of the first node due to leakage of charge from the first node; and
- refreshing the memory cell by supplying the memory cell with a refresh potential, wherein the memory cell comprises:
- a first transistor comprising a gate, a source, and a drain;
- a second transistor comprising a gate, a source, and a drain; and
- a first capacitor comprising a first electrode and a second electrode, wherein the first node is electrically connected to the gate of the first transistor, one of the source and the drain of the second transistor, and one of the first electrode and the second electrode of the first capacitor, and wherein the refresh potential is a sum of the potential read from the first node and the potential corresponding to the change of the potential of the first node.

18. The method according to claim 17, wherein the refreshing is performed plural times with an interval, wherein the interval is determined with a refresh timing control circuit which comprises:
- a third transistor comprising a gate, a source, and a drain; and
- a second capacitor comprising a first electrode and a second electrode, and wherein the interval is determined by using a decrease in potential of a second node which is connected to one of the source and the drain of the third transistor and one of the first electrode and the second electrode of the second capacitor.

19. The method according to claim 17, wherein the potential corresponding to the change of the potential of the first node is estimated with a compensation voltage generator circuit which comprises:
- a fourth transistor comprising a gate, a source, and a drain; and
- a third capacitor comprising a first electrode and a second electrode, and wherein the potential corresponding to the change of the potential of the first node is estimated by a decrease in potential of a third node which is connected to one of the source and the drain of the fourth transistor and one of the first electrode and the second electrode of the third capacitor.

* * * * *